(12) United States Patent
Park et al.

(10) Patent No.: US 7,492,095 B2
(45) Date of Patent: Feb. 17, 2009

(54) DOUBLE-SIDED LIGHT EMITTING DEVICE

(75) Inventors: Jin-Woo Park, Yongin-si (KR); Ho-Kyoon Chung, Yongin-si (KR); Sun-Hwa Kim, Suwon-si (KR); Byung-Hee Kim, Yongin (KR)

(73) Assignee: Samsung Mobile Display Co., Ltd., Suwon-si (KR)

( * ) Notice: Subject to any disclaimer, the term of this patent is extended or adjusted under 35 U.S.C. 154(b) by 557 days.

(21) Appl. No.: 10/849,193

(22) Filed: May 20, 2004

(65) Prior Publication Data

US 2004/0251823 A1 Dec. 16, 2004

(30) Foreign Application Priority Data

May 28, 2003 (KR) .................... 10-2003-0034179
Nov. 29, 2003 (KR) .................... 10-2003-0086116

(51) Int. Cl.
*H01J 1/62* (2006.01)
(52) U.S. Cl. .................... 313/506; 313/110; 313/112
(58) Field of Classification Search ......... 313/503–512, 313/110, 112
See application file for complete search history.

(56) References Cited

U.S. PATENT DOCUMENTS 5,596,246 A 1/1997 Budzilek et al.
5,831,375 A * 11/1998 Benson, Jr. ............ 313/110
2004/0070809 A1 4/2004 Senbonmatsu
2006/0007372 A1 * 1/2006 Yuuki et al. ............ 349/96

FOREIGN PATENT DOCUMENTS

| CN | 1492719 | 4/2004 |
|---|---|---|
| JP | 10-255976 | 9/1998 |
| JP | 11-045058 | 2/1999 |
| JP | 2001-035653 | 2/2001 |
| JP | 2001-332392 | 11/2001 |
| JP | 2001-356714 | 12/2001 |
| JP | 2003-058069 | 2/2003 |
| JP | 2003-140561 | 5/2003 |
| JP | 2004-95340 | 3/2004 |
| JP | 2004-361423 | 12/2004 |

OTHER PUBLICATIONS

Korean Office Action issued Jun. 21, 2005 in corresponding Korean Patent Application No. 22003-34179.
Korean Patent Abstract of Publication No. 1020030013923, published Feb. 15, 2003.

* cited by examiner

*Primary Examiner*—Joseph L Williams
(74) *Attorney, Agent, or Firm*—Stein, McEwen & Bui, LLP

(57) ABSTRACT

A double-sided light emitting device including lower and upper substrates, an emission element formed between an inner surface of the upper substrate and an inner surface of the lower substrate and emitting predetermined light, an upper layer of polarizing material disposed on at least one of inner and outer surfaces of the upper substrate, and a lower layer of polarizing material disposed on at least one of inner and outer surfaces of the lower substrate.

13 Claims, 23 Drawing Sheets

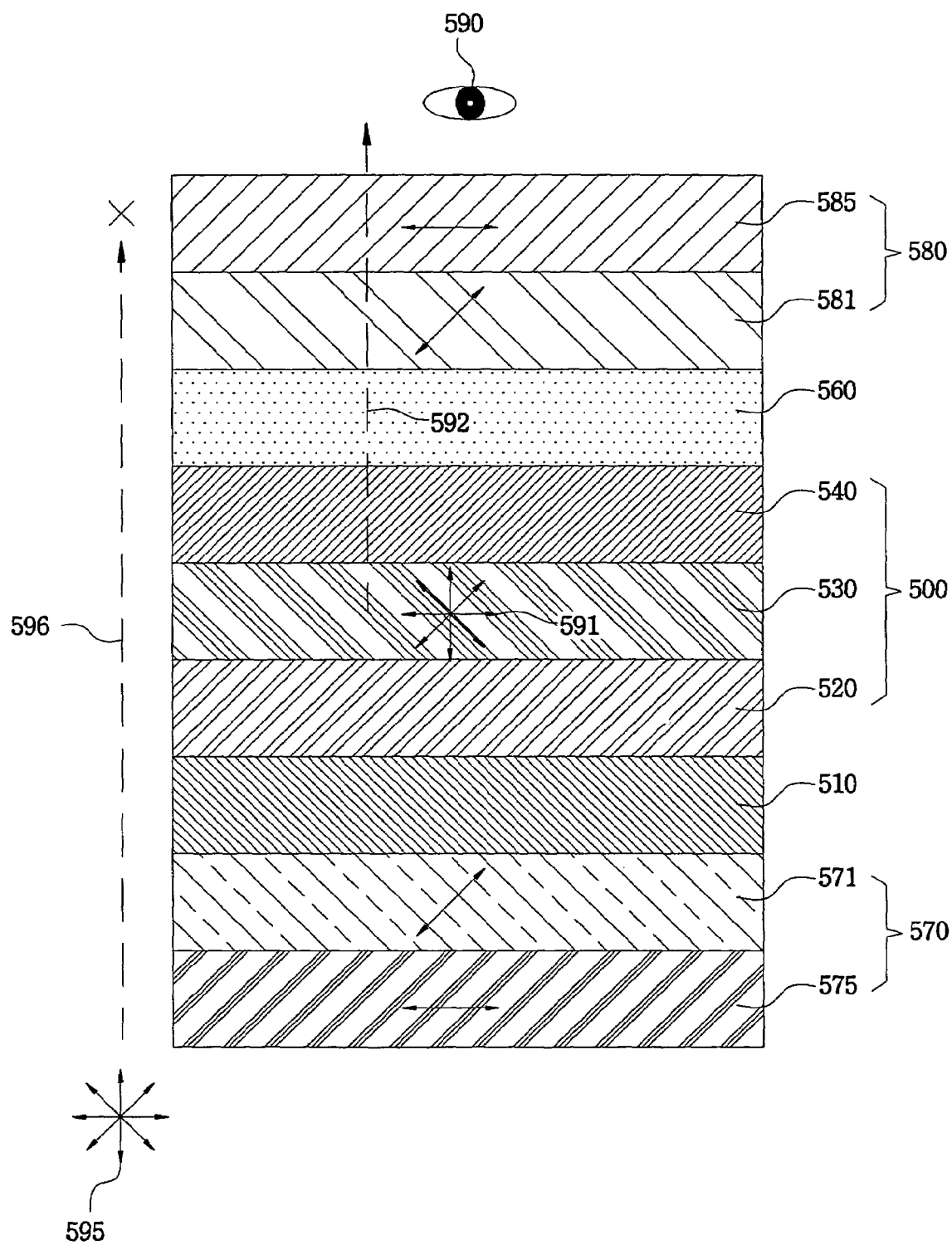

DOUBLE-SIDED LIGHT EMITTING DEVICE

CROSS-REFERENCE TO RELATED APPLICATIONS

This application claims the benefit of Korean Patent Application No. 2003-34179, filed on May 28, 2003 and No. 2003-86116, filed on Nov. 29, 2003, the disclosures of which are incorporated herein by reference.

BACKGROUND OF THE INVENTION

1. Field of the Invention

The present invention relates to a flat panel display and, more particularly, to a double-sided organic light emitting device capable of preventing definition of image quality from being deteriorated by external light.

2. Description of the Related Art

Flat panel displays such as organic light emitting devices, field emission displays (FEDs) and so forth are subjected to considerable decrease in contrast according to intensity of external light. To prevent this phenomenon, for example, a black matrix for blocking external light has been used. In spite of using such a black matrix, it is very difficult to completely block the external light on an emission region to make a black state.

Meanwhile, such an organic light emitting device for blocking the external light using a circular-polarizing plate is disclosed in U.S. Pat. No. 5,596,246. The conventional organic light emitting device using the circular-polarizing plate is provided with an organic electroluminescent (EL) element consisting of a transparent electrode, an organic emission layer and a reflective electrode formed on an insulating substrate. The insulating substrate is encapsulated with an encapsulating substrate using a sealant (not shown in the drawing), and a circular-polarizing plate consisting of a linear-polarizing plate and a λ/4 compensating plate disposed on an outer surface of the insulating substrate.

The conventional organic light emitting device constructed as set forth above is designed so that an angle between a retardation axis of the λ/4 compensating plate and a polarization axis of the linear-polarizing plate becomes 45 degrees. Thus, the external light passes through the linear-polarizing plate to become linear-polarized light, and the linear-polarized light passes through the λ/4 compensating plate to become circular-polarized light. The circular-polarized light is reflected through the reflective electrode, and become linear-polarized light through the λ/4 compensating plate. The linear-polarized light is absorbed and blocked through the linear-polarizing plate. The conventional organic light emitting device as above-mentioned has an advantage in that it can improve contrast by blocking the external light using the circular-polarizing plate, but has a disadvantage in that it requires a separate reflective plate in order to block the external light.

SUMMARY OF THE INVENTION

It is, therefore, an aspect of the present invention to provide a double-sided organic light emitting device capable of improving a contrast by blocking external light.

It is another aspect of the invention to provide a double-sided organic light emitting device capable of blocking reflected external light as well as bottom transmitted light.

It is yet another aspect of the invention to provide a double-sided organic light emitting device capable of increasing a definition of image quality.

It is yet another aspect of the invention to provide a double-sided organic light emitting device capable of increasing a definition of image quality by blocking external light both at an image viewing position and at its opposite position.

In order to accomplish these and/or other aspects there is provided a double-sided light emitting device comprising lower and upper substrates, an emission element formed between an inner surface of the upper substrate and an inner surface of the lower substrate and emitting predetermined light, an upper layer of polarizing material disposed on at least one of inner or outer surfaces of the upper substrate, and a lower layer of polarizing material disposed on at least one of inner or outer surfaces of the lower substrate.

The lower and upper layers of polarizing material are coating layers coated on the outer surfaces of the lower and upper substrates respectively, or coating layers coated on the inner surfaces of the lower and upper substrates respectively. The upper layer of polarizing material is a coating layer coated on the inner surface of the upper substrate, and the lower layer of polarizing material is a coating layer coated on the outer surface of the lower substrate, and alternatively, the upper layer of polarizing material is a coating layer coated on the outer surface of the upper substrate, and the lower layer of polarizing material is a coating layer coated on the inner surface of the lower substrate. Furthermore, the lower and upper layers of polarizing material are disposed so that their polarization axes are perpendicular to each other, and each are a coating layer having a thickness from about 0.1 μm to 50.0 μm.

According to another aspect of the present invention, there is provided a double-sided light emitting device, which comprises lower and upper substrates, an emission element formed between an inner surface of the upper substrate and an inner surface of the lower substrate and emitting predetermined light, an upper polarizing plate disposed on any one of inner or outer surfaces of the upper substrate, and a lower polarizing plate disposed on any one of inner or outer surfaces of the lower substrate.

The lower and upper polarizing plates are polarizing films bonded on the inner surfaces of the lower and upper substrates respectively. The upper polarizing plate may be a polarizing film bonded on the inner surface of the upper substrate, and the lower polarizing plate may be a polarizing film bonded on the outer surface of the lower substrate. Further, the upper polarizing plate may be a polarizing film bonded on the outer surface of the upper substrate, and the lower polarizing plate may be a polarizing film bonded on the inner surface of the lower substrate. Otherwise, the lower and upper polarizing plates are polarizing films bonded on the outer surfaces of the lower and upper substrates, respectively. Further, the lower and upper polarizing plates are disposed so that their polarization axes are perpendicular to each other, and each is a polarizing film having a thickness from about 50 μm to 300 μm.

According to yet another aspect of the present invention, there is provided a double-sided light emitting device, which comprises lower and upper substrates, an emission element formed between an inner surface of the upper substrate and an inner surface of the lower substrate and emitting predetermined light, an upper polarizing element disposed on any one of inner or outer surfaces of the upper substrate, a lower polarizing element disposed on any one of inner or outer surfaces of the lower substrate, an upper compensating plate disposed between the upper polarizing element and the emission element, and a lower compensating plate disposed between the lower polarizing element and the emission element, wherein a retardation value of each of the lower and upper compensating plates is λ/4, and each angle between the lower and upper compensating plates and the lower and upper polarizing plates.

Here, a crossing angle between a retardation axis of the lower compensating plate disposed between the lower polarizing element and the emission element and a polarization axis of the lower polarizing element has a direction opposite to a crossing angle between a retardation axis of the upper compensating plate disposed between the upper polarizing element and the emission element a polarization axis of the upper polarizing element.

The lower polarizing element is disposed on the outer surface of the lower substrate, and the lower compensating plate is disposed between the lower polarizing element and the outer surface of the lower substrate, and the upper polarizing element is disposed on the outer surface of the upper substrate, and the upper compensating plate is disposed between the upper polarizing element and the outer surface of the upper substrate. Otherwise, the lower polarizing element is disposed on the outer surface of the lower substrate, and the lower compensating plate is disposed between the lower polarizing element and the outer surface of the lower substrate, and the upper polarizing element is disposed on the inner surface of the upper substrate, and the upper compensating plate is disposed between the upper polarizing element and the inner surface of the upper substrate.

Alternatively, the lower polarizing element may be disposed on the inner surface of the lower substrate, and the lower compensating plate may be disposed between the lower polarizing element and the inner surface of the lower substrate, and the upper polarizing element may be disposed on the inner surface of the upper substrate, and the upper compensating plate may be disposed between the upper polarizing element and the inner surface of the upper substrate. Otherwise, the lower polarizing element may be disposed on the inner surface of the lower substrate, and the lower compensating plate may be disposed between the lower polarizing element and the inner surface of the lower substrate, and the upper polarizing element may be disposed on the outer surface of the upper substrate, and the upper compensating plate may be disposed between the upper polarizing element and the outer surface of the upper substrate.

Furthermore, the lower and upper compensating plates include at least one compensating film having a predetermined phase difference retardation axis. When a phase difference retardation axis of each of the lower and upper compensating plates is λ/4 and angles between retardation axes of the lower and upper compensating plates and polarization axes of the lower and upper polarizing elements are opposite to each other, external light which is incident and transmitted from a position opposite to an observing position of light emitted from the emission element is no longer transmitted toward an observer regardless of not only an angle between polarization axis of the upper polarizing element and the phase difference retardation axes of the lower and upper compensating plates but also an angle between polarization axis of the lower polarizing element and the phase difference retardation axes of the lower and upper compensating plates.

According to yet still another aspect of the present invention, there is provided a double-sided light emitting device, which comprises lower and upper substrates, an emission element formed between an inner surface of the upper substrate and an inner surface of the lower substrate and emitting predetermined light, an upper polarizing element disposed on any one of inner and outer surfaces of the upper substrate, a lower polarizing element disposed on any one of inner and outer surfaces of the lower substrate, and an upper compensating plate disposed between the upper polarizing element and the emission element, and a lower compensating plate disposed between the lower polarizing element and the emission element, wherein angle between phase difference retardation axis of the lower compensating plate and polarization axis of the lower polarizing element and angle between phase difference retardation axis of the upper compensating plate and polarization axis of the upper polarizing element are opposite to each other, and wherein at a position where light emitted from the emission element is observed, light emitted from the emission element is transmitted, and all external light incident at the observed position of the light and at a position opposite to the observed position of the light are blocked, and external light reflected within the emission element is blocked.

According to yet still another aspect of the present invention, there is provided a double-sided light emitting device comprising lower and upper substrates, an emission element formed between an inner surface of the upper substrate and an inner surface of the lower substrate and emitting predetermined light, an upper polarizing element disposed on any one of inner and outer surfaces of the upper substrate, and a lower polarizing element disposed on any one of inner and outer surfaces of the lower substrate, wherein the lower and upper polarizing elements are disposed so that polarization axes of the lower and upper polarizing elements perpendicular to each other, and wherein at a position where light emitted from the emission element is observed, light emitted from the emission element is transmitted and all external light incident at the observed position of the light and at a position opposite to the observed position of the light are blocked.

The lower and upper polarizing elements each are a coating layer of polarizing material having a thickness from about 0.1 μm to 50.0 μm, or a polarizing film having a thickness from about 50 μm to 300 μm. The lower and upper polarizing elements are disposed any one of on the inner surfaces of the lower and upper substrates respectively and on the outer surfaces of the lower and upper substrates respectively, and otherwise the lower and upper polarizing elements are disposed on the inner surface of the upper substrate and the outer surface of the lower substrate respectively, or on the outer surface of the upper substrate and the inner surface of the lower substrate respectively.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which:

FIGS. 14A and 14B are views explaining a principle of blocking external light in the double-sided organic light emitting device according to the ninth embodiment of the invention;

DETAILED DESCRIPTION OF THE PREFERRED EMBODIMENTS

Figure 1:
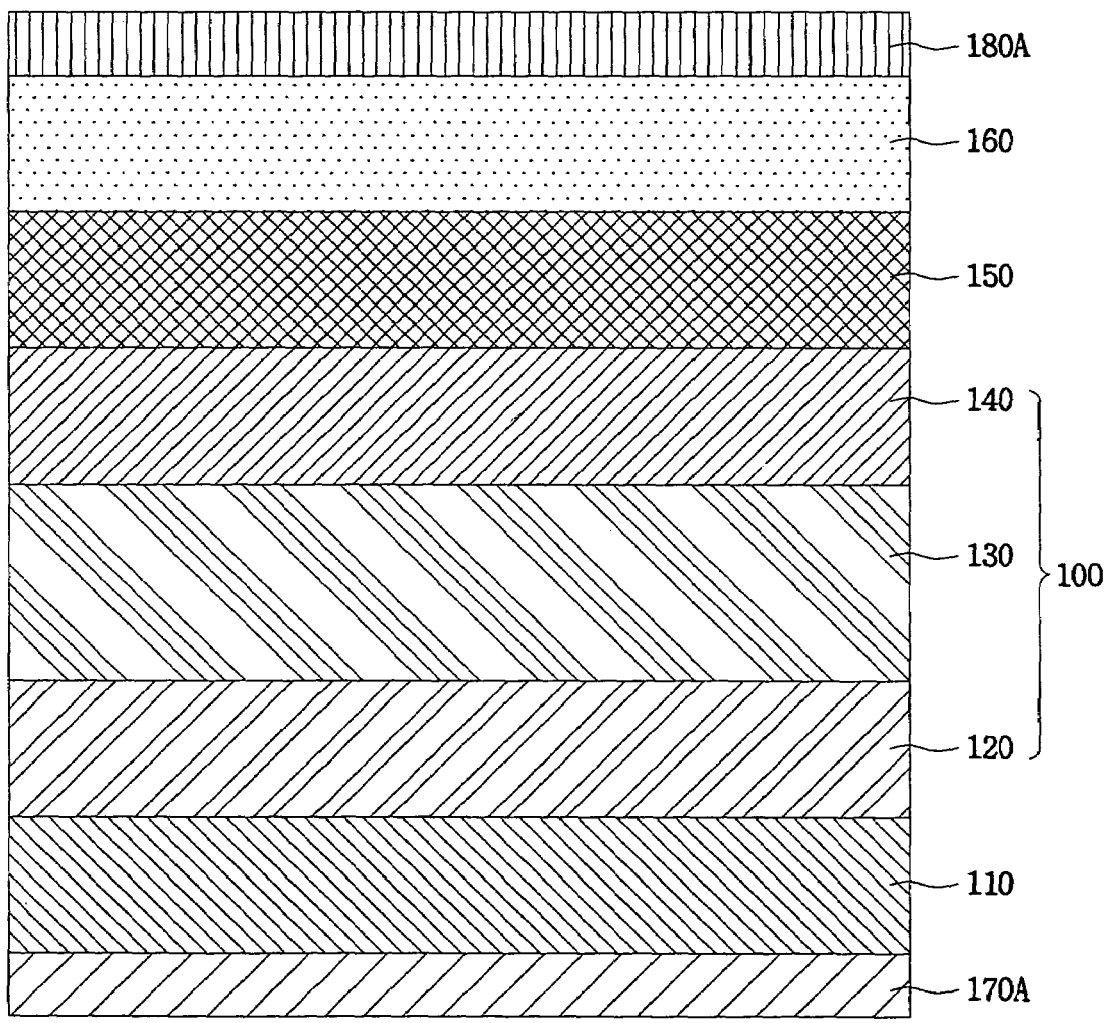
FIG. 1 shows a cross-sectional structure of a double-sided organic light emitting device according to a first embodiment of the invention.

Reference will now be made in detail to the embodiments of the present invention, examples of which are illustrated in the accompanying drawings, wherein like reference numerals refer to the like elements throughout. The embodiments are described below to explain the present invention by referring to the figures.

FIG. 1 shows a cross-sectional structure of a double-sided organic light emitting device according to a first embodiment of the invention.

Referring to FIG. 1, there is an insulating substrate as a lower substrate 110, on which an anode electrode 120 is formed. An organic thin layer 130 is formed on the anode electrode 120. A cathode electrode 140 is formed on the organic thin layer 130. A passivation layer 150 is formed on the cathode electrode 140. An encapsulating substrate 160 as an upper substrate is bonded and encapsulated to the lower substrate 110 using a sealant (not shown).

The lower and upper substrates 110 and 160 may make use of a transparent substrate such as a glass substrate. The anode electrode 120 is a transparent electrode, which is formed by depositing and patterning transparent conductive layer of ITO (Indium Tin Oxide), IZO (Indium Zinc Oxide) or so forth on an inner surface of the lower substrate 110. The organic thin layer 130 includes at least one of a hole injecting layer (HIL), a hole transporting layer (HTL), an emission layer, a hole blocking layer (HBL), an electron transporting layer (ETL) and an electron injecting layer (EIL). The cathode electrode 140 is also a transparent electrode, which is formed by depositing a metal layer of Ca, LiF or so forth which has a low work function. The passivation layer 150 is formed using a transparent sealant, so that it is possible not only to guarantee a lifetime of the organic light emitting device exposed in the air but also prevent oxidation of the cathode electrode 140 or the anode electrode 120.

Lower and upper polarizing elements 170A and 180A are arranged on outer surfaces of the lower and upper substrates 110 and 160, respectively. The polarizing elements 170A and 180A are layers of a polarizing material, which are coated on the outer surfaces of the substrates 110 and 160, respectively. Further, the layer of the polarizing material is formed by coating a polarizing solution available from OPTIVA INC. at a thickness from about 0.1 μm to 50.0 μm.

Here, preferably, both the lower polarizing element 170A arranged on the outer surface of the lower substrate 110 and the upper polarizing element 180A arranged on the outer surface of the upper substrate 160 have their polarization axes perpendicular to each other. Hence, the lower and upper polarizing elements 170A and 180A may be integrally formed with the lower and upper substrates 110 and 160.

In the first embodiment, the lower substrate 110 on which an electroluminescent (EL) element 100 is formed is encapsulated with the upper substrate 160, and then the lower and upper polarizing elements are formed by coating the layers 170A and 180A of the polarizing material on the outer surfaces of the lower and upper substrates 110 and 160. Thereby, the organic light emitting device can be fabricated.

Alternatively, the lower and upper polarizing elements may be formed by coating the layers 170A and 180A of the polarizing material on the outer surfaces of the lower and upper substrates 110 and 160, and then the EL element 100 may be formed on the lower substrate 110, and finally the lower substrate may be encapsulated with the upper substrate. Thereby, the organic light emitting device may be fabricated.

Figure 2:
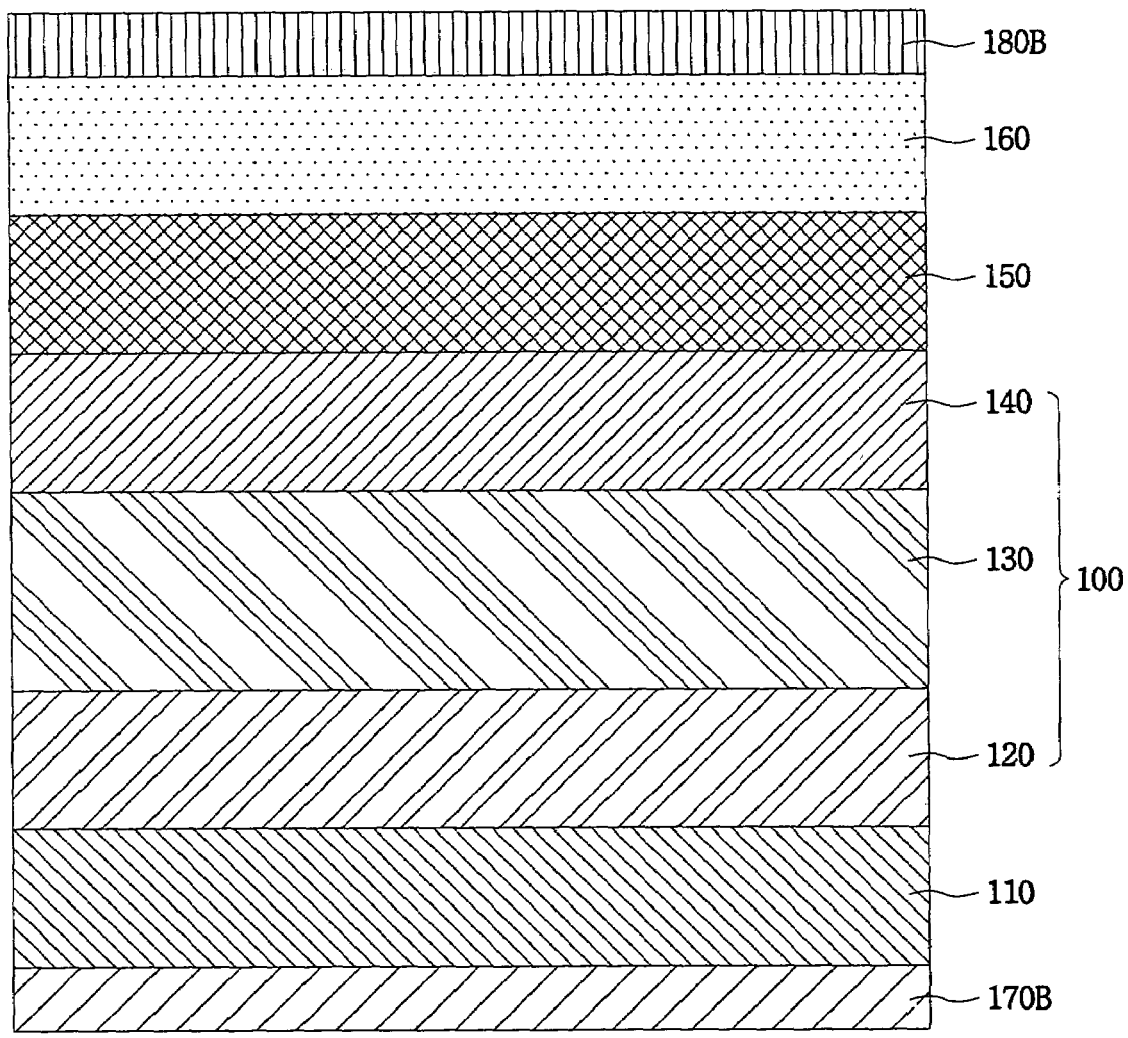
FIG. 2 shows a cross-sectional structure of a double-sided organic light emitting device according to a second embodiment of the invention.

FIG. 2 shows a cross-sectional structure of a double-sided organic light emitting device according to a second embodiment of the invention. Similarly to that of the first embodiment, the organic light emitting device according to the second embodiment has a structure where polarizing elements 170B and 180B are formed on the outer surfaces of the lower and upper substrates 110 and 160, respectively.

Here, the lower polarizing element 170B and the upper polarizing element 180B are polarizing plates bonded on the outer surfaces of the substrates 110 and 160, respectively. Each of the polarizing plates 170B and 180B is formed by bonding a polarizing film between about 50 to 300 μm in thickness on each outer surface of the lower and upper substrates 110 and 160. In this case, the lower polarizing element 170B bonded on the outer surface of the lower substrate 110 and the upper polarizing element 180B bonded on the outer surface of the upper substrate 160 are preferably bonded in such a manner that their polarization axes are perpendicular to each other.

In the second embodiment, the lower substrate 110 on which the emission element 100 is formed is encapsulated with the upper substrate 160, and then the lower and upper polarizing elements are formed by bonding the lower and upper polarizing films 170B and 180B on the outer surfaces of the lower and upper substrates 110 and 160. Thereby, the organic light emitting device can be fabricated.

Alternatively, the lower and upper polarizing elements may be formed by bonding the lower and upper polarizing films 170B and 180B on the outer surfaces of the lower and upper substrates 110 and 160, and then the EL element 100 may be formed on the lower substrate 110, and finally the lower substrate 110 may be encapsulated with the upper substrate 160. Thereby, the organic light emitting device may be fabricated.

Figure 3:
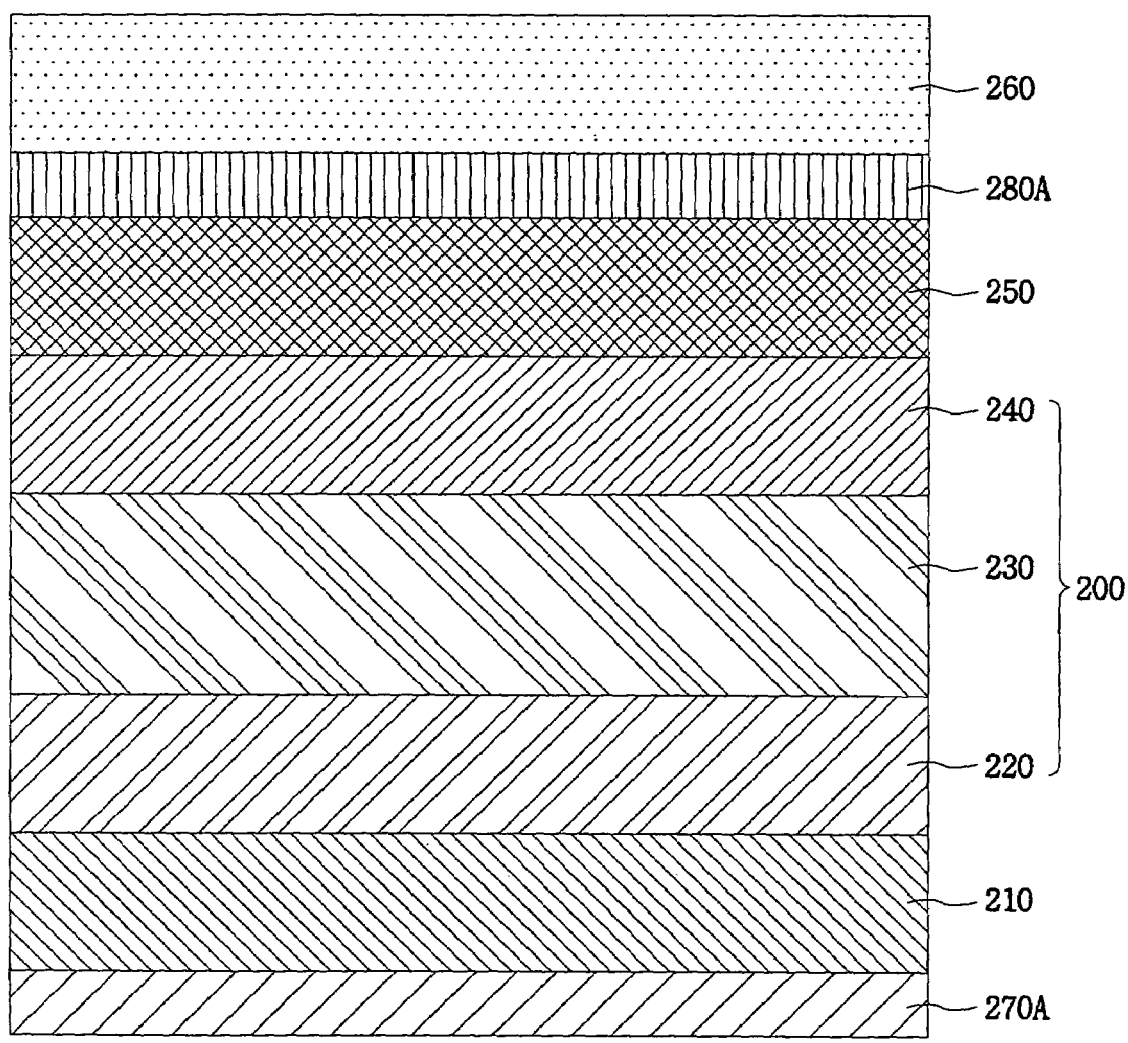
FIG. 3 shows a cross-sectional structure of a double-sided organic light emitting device according to a third embodiment of the invention.

FIG. 3 shows a cross-sectional structure of a double-sided organic light emitting device according to a third embodiment of the invention. The organic light emitting device according to the third embodiment has a structure where a lower polarizing element 270A is arranged on an outer surface of a lower substrate 210, and an upper polarizing element 280A is arranged on an inner surface of an upper substrate 260.

Referring to FIG. 3, in the first embodiment, an inner surface of the lower substrate 210 is provided with an emission element 200, which includes an anode electrode 220 as a lower electrode, an organic thin layer 230 and a cathode electrode 240 as an upper electrode. A passivation layer 250 is formed on the cathode electrode 240. The upper substrate 260 is bonded and encapsulated to the lower substrate 210 using a sealant (not shown).

The polarizing elements 270A and 280A are arranged on an outer surface of the lower substrate 210 and an inner surface of the upper substrate 260, respectively. The polarizing elements 270A and 280A are layers of a polarizing material which are coated on an outer surface of the lower substrate 210 and an inner surface of the upper substrate 260, respectively. Further, the layer of the polarizing material is formed by coating a polarizing solution available from OPTIVA INC. at a thickness from about 0.1 μm to 50.0 μm.

Here, both the lower polarizing element 270A arranged on the outer surface of the lower substrate 210 and the upper polarizing element 280A arranged on the inner surface of the upper substrate 260 are preferably formed in such a manner that their polarization axes are perpendicular to each other. Hence, the lower and upper polarizing elements 270A and 280A whose polarization axes are perpendicular to each other may be integrally formed with the lower and upper substrates 210 and 260.

In the third embodiment, the emission element 200 is formed on the lower substrate 210, and then the lower and upper polarizing elements are formed by coating the layers 270A and 280A of the polarizing material on the outer surface of the lower substrate 210 and the inner surface of the upper substrate 260. Thereby, the organic light emitting device can be fabricated.

Alternatively, the lower and upper polarizing elements are formed by coating the layers 270A and 280A of the polarizing material on the outer surface of the lower substrate 210 and the inner surface of the upper substrate 260, and then the emission element 200 may be formed on the lower substrate 210, and finally the lower substrate 210 may be encapsulated with the upper substrate 260. Thereby, the organic light emitting device may be fabricated.

Figure 4:
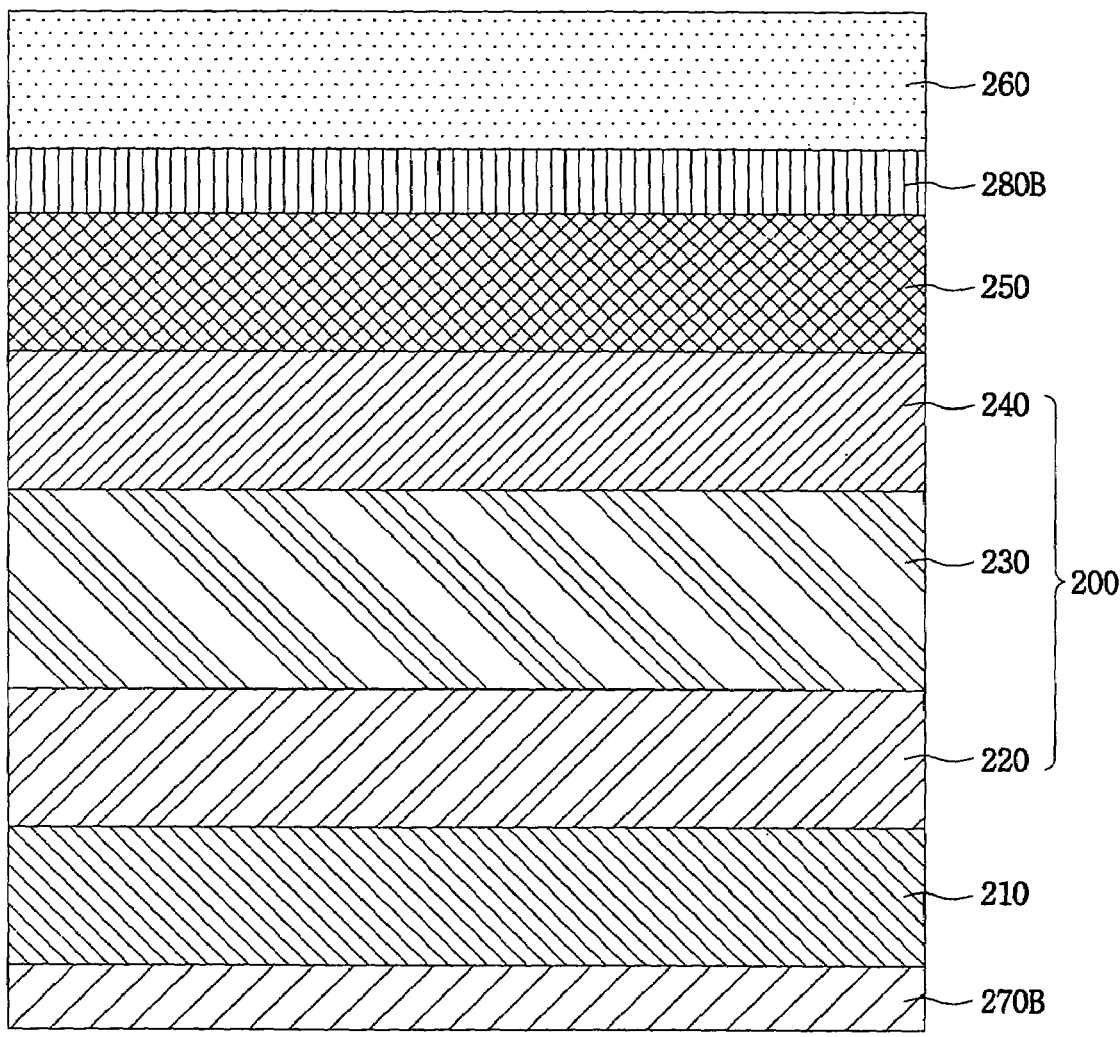
FIG. 4 shows a cross-sectional structure of a double-sided organic light emitting device according to a fourth embodiment of the invention.

FIG. 4 shows a cross-sectional structure of a double-sided organic light emitting device according to a fourth embodiment of the invention. As in the third embodiment, the organic light emitting device according to the fourth embodiment has a structure where a lower polarizing element 270B is arranged on the outer surface of the lower substrate 210 and an upper polarizing element 280B is arranged on the inner surface of the upper substrate 260.

Here, the lower polarizing element 270B and the upper polarizing element 280B are polarizing plates, one polarizing element 270B bonded on the outer surfaces of the lower substrate 210 and the other 280B is bonded on the inner surface of the upper substrate 260. The polarizing plates 270B and 280B are formed by bonding a polarizing film between about 50 to 300 μm in thickness on the outer surfaces of the lower substrate 210 and on the inner surface of the upper substrate 260. In this case, the lower polarizing element 270B bonded on the outer surface of the lower substrate 210 and the upper polarizing element 280B bonded on the inner surface of the upper substrate 260 are preferably bonded in such a manner that their polarization axes are perpendicular to each other.

In the fourth embodiment, the emission element 200 is formed on the lower substrate 210, and then the lower and upper polarizing elements are formed by bonding the lower and upper polarizing films 270B and 280B on the outer surfaces of the lower substrate 210 and on the inner surface of the upper substrate 260. Thereby, the organic light emitting device can be fabricated.

Alternatively, the lower and upper polarizing elements may be formed by bonding the lower and upper polarizing films 270B and 280B on the outer surfaces of the lower substrate 210 and on the inner surface of the upper substrate 260, and then the emission element 200 may be formed on the lower substrate 210, and finally the lower substrate 210 may be encapsulated with the upper substrate 260. Thereby, the organic light emitting device may be fabricated.

Figure 5:
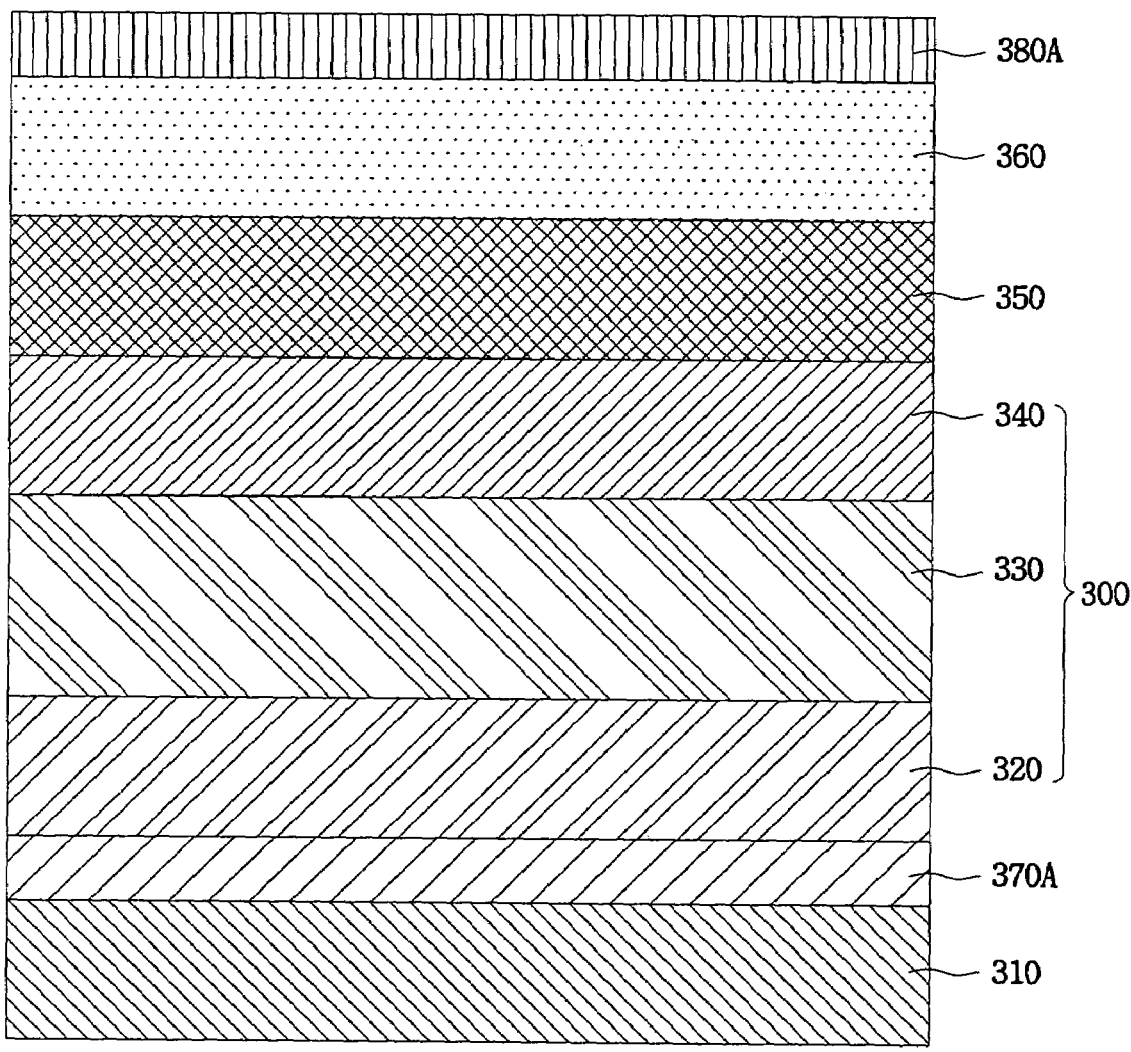
FIG. 5 shows a cross-sectional structure of a double-sided organic light emitting device according to a fifth embodiment of the invention.

FIG. 5 shows a cross-sectional structure of a double-sided organic light emitting device according to a fifth embodiment of the invention. The organic light emitting device according to the fifth embodiment has a structure where a lower polarizing element 370A is arranged on an inner surface of a lower substrate 310, and an upper polarizing element 380A is arranged on an outer surface of an upper substrate 360.

Referring to FIG. 5, as in the first embodiment, an inner surface of the lower substrate 310 is provided with an emission element 300, which includes an anode electrode 320 as a lower electrode, an organic thin layer 330 and a cathode electrode 340 as an upper electrode. A passivation layer 350 is formed on the cathode electrode 340. The upper substrate 360 is bonded and encapsulated to the lower substrate 310 using a sealant (not shown).

The polarizing elements 370A and 380A are arranged on an inner surface of the lower substrate 310 and an outer surface of the upper substrate 360, respectively. The polarizing elements 370A and 380A are layers of a polarizing material which are coated on an inner surface of the lower substrate 310 and an outer surface of the upper substrate 360, respectively. Further, the layer of the polarizing material is formed by coating a polarizing solution available from OPTIVA INC. at a thickness from about 0.1 μm to 50.0 μm.

Here, both the lower polarizing element 370A arranged on the inner surface of the lower substrate 310 and the upper polarizing element 380A arranged on the outer surface of the upper substrate 260 are preferably formed in such a manner that their polarization axes are perpendicular to each other. Hence, the lower and upper polarizing elements 370A and 380A whose polarization axes are perpendicular to each other may be integrally formed with the lower and upper substrates 310 and 360.

In the fifth embodiment, the lower and upper polarizing elements 370A and 380A are formed by coating the layers of the polarizing material on the inner surface of the lower substrate 310 and the outer surface of the upper substrate 360, and then the emission element 300 is formed on the layer 370A of the polarizing material and is encapsulated with the upper substrate which is provided with the layer 380A of the polarizing material on the outer surface thereof. Thereby, the organic light emitting device can be fabricated.

Figure 6:
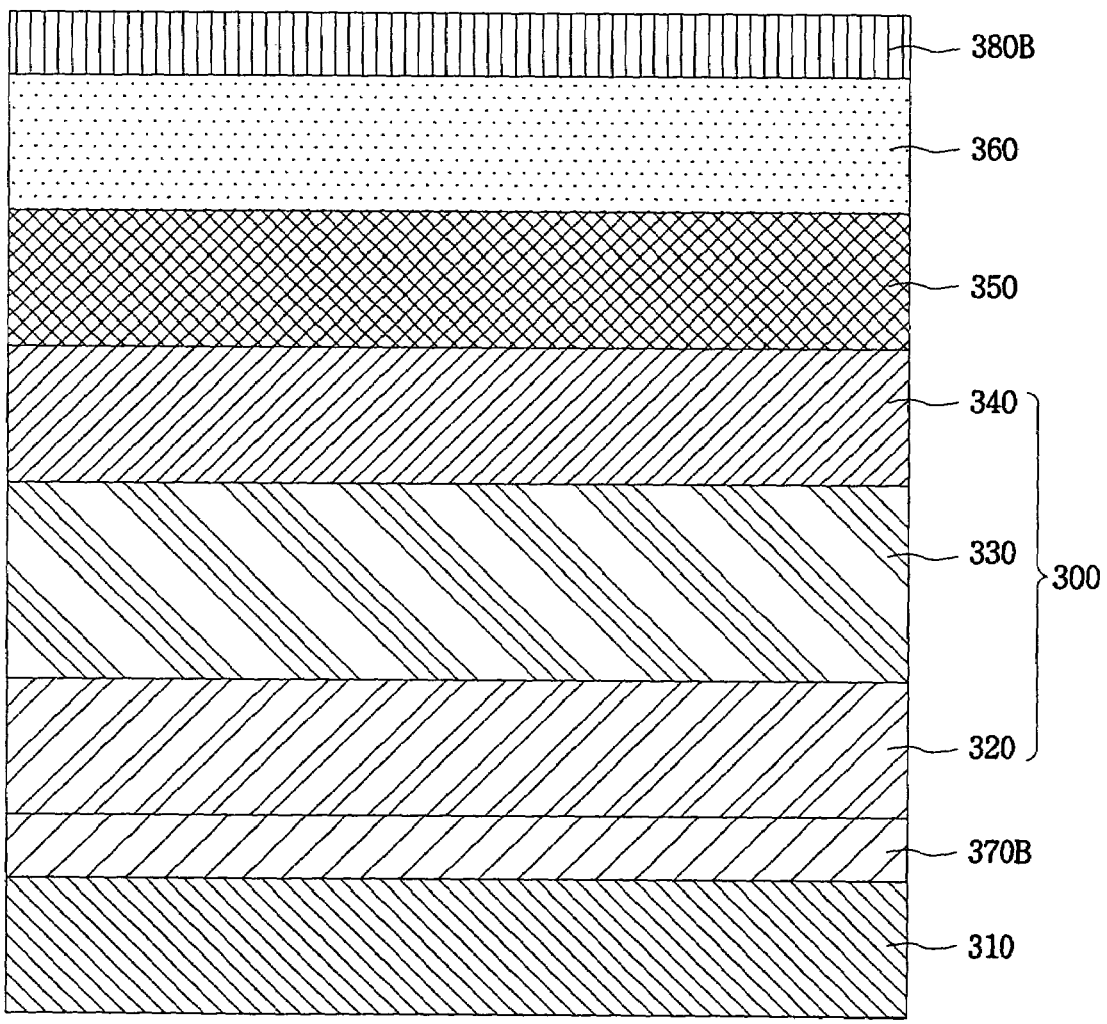
FIG. 6 shows a cross-sectional structure of a double-sided organic light emitting device according to a sixth embodiment of the invention.

FIG. 6 shows a cross-sectional structure of a double-sided organic light emitting device according to a sixth embodiment of the invention. As in the fifth embodiment, the organic light emitting device according to the sixth embodiment has a structure where a lower polarizing element 370B is arranged on an inner surface of a lower substrate 310, and an upper polarizing element 380A is arranged on an outer surface of an upper substrate 360.

Here, the lower polarizing element 370B and the upper polarizing element 380B are polarizing plates, one polarizing element 370B is bonded on the inner surface of the lower substrate 310 and the other polarizing element 380B is bonded on the outer surface of the upper substrate 360. The polarizing plates 370B and 380B are formed by bonding a polarizing film between about 50 to 300 µm in thickness on the inner surfaces of the lower substrate 310 and on the outer surface of the upper substrate 360. In this case, the lower polarizing element 370B bonded on the inner surface of the lower substrate 310 and the upper polarizing element 380B bonded on the outer surface of the upper substrate 360 are preferably bonded in such a manner that their polarization axes are perpendicular to each other.

In the sixth embodiment, the lower and upper polarizing elements are formed by bonding the lower and upper polarizing films 370B and 380B on the inner surfaces of the lower substrate 310 and on the outer surface of the upper substrate 360, and then the emission element 300 is formed on the lower polarizing film 370B, and finally the lower substrate 310 is encapsulated with the upper substrate 360. Thereby, the organic light emitting device can be fabricated.

Figure 7:
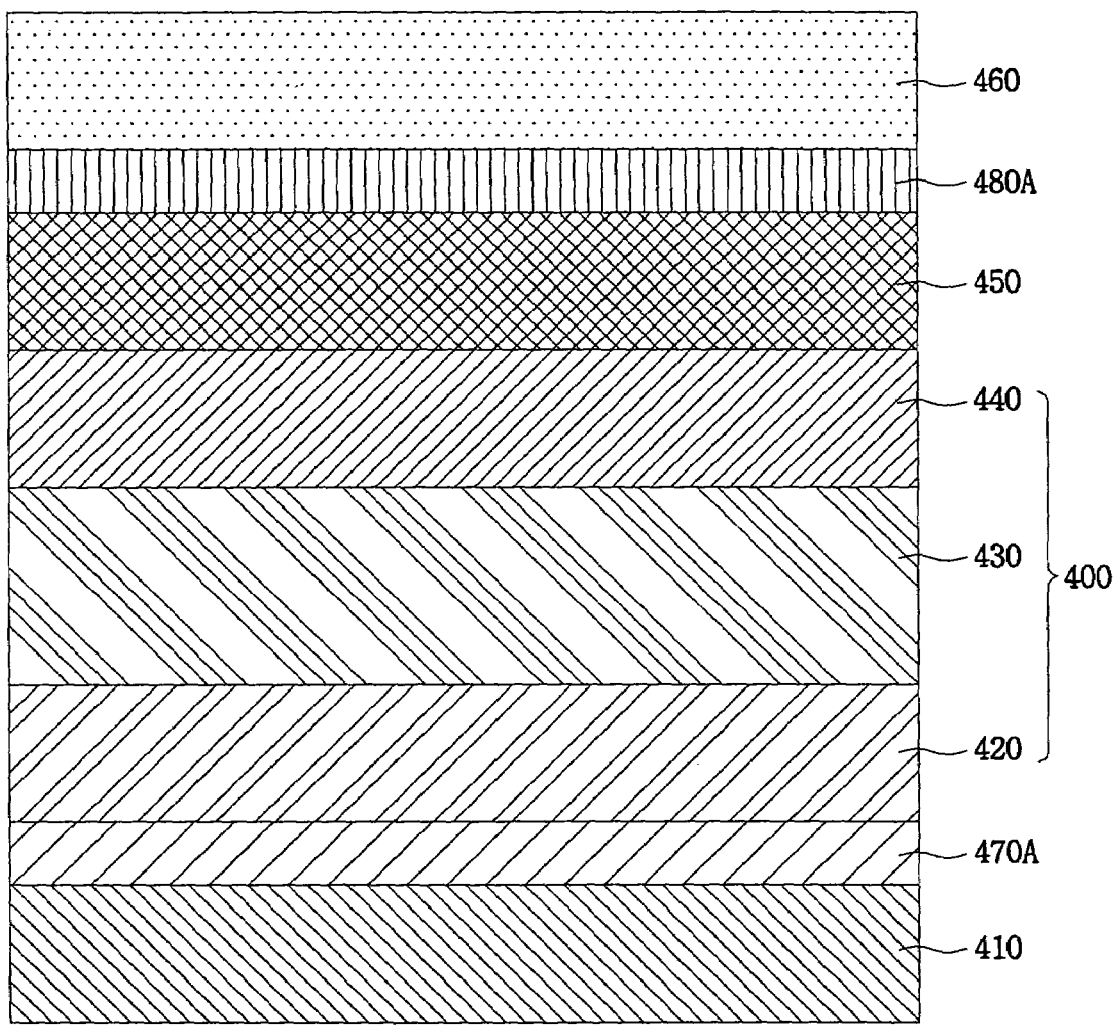
FIG. 7 shows a cross-sectional structure of a double-sided organic light emitting device according to a seventh embodiment of the invention.

FIG. 7 shows a cross-sectional structure of a double-sided organic light emitting device according to a seventh embodiment of the invention. The organic light emitting device according to the seventh embodiment has a structure where lower and upper polarizing elements 470A and 480A are arranged on inner surfaces of lower and upper substrates 410 and 460, respectively.

Referring to FIG. 7, as in the first embodiment, the inner surface of the lower substrate 410 is provided with an emission element 400, which includes an anode electrode 420 as a lower electrode, an organic thin layer 430 and a cathode electrode 440 as an upper electrode. A passivation layer 450 is formed on the cathode electrode 440. The upper substrate 460 is encapsulated to the lower substrate 410 using a sealant (not shown).

The polarizing elements 470A and 480A are arranged on the inner surfaces of the lower and upper substrates 410 and 460, respectively. The polarizing elements 470A and 480A are layers of a polarizing material which are coated on the inner surfaces of the lower and upper substrates 410 and 460, respectively. Further, the layer of the polarizing material is formed by coating a polarizing solution available from OPTIVA INC. at a thickness from about 0.1 µm to 50.0 µm.

Here, both the lower polarizing element 470A arranged on the inner surface of the lower substrate 410 and the upper polarizing element 480A arranged on the inner surface of the upper substrate 460 are preferably formed in such a manner that their polarization axes are perpendicular to each other. Hence, the lower and upper polarizing elements 470A and 480A whose polarization axes are perpendicular to each other may be integrally formed with the lower and upper substrates 410 and 460.

In the seventh embodiment, the lower and upper polarizing elements 470A and 480A are formed by coating the layers of the polarizing material on the inner surfaces of the lower and upper substrates 410 and 460, and then the emission element 400 is formed on the lower polarizing element 470A and is encapsulated with the upper substrate 460. Thereby, the organic light emitting device can be fabricated.

Figure 8:
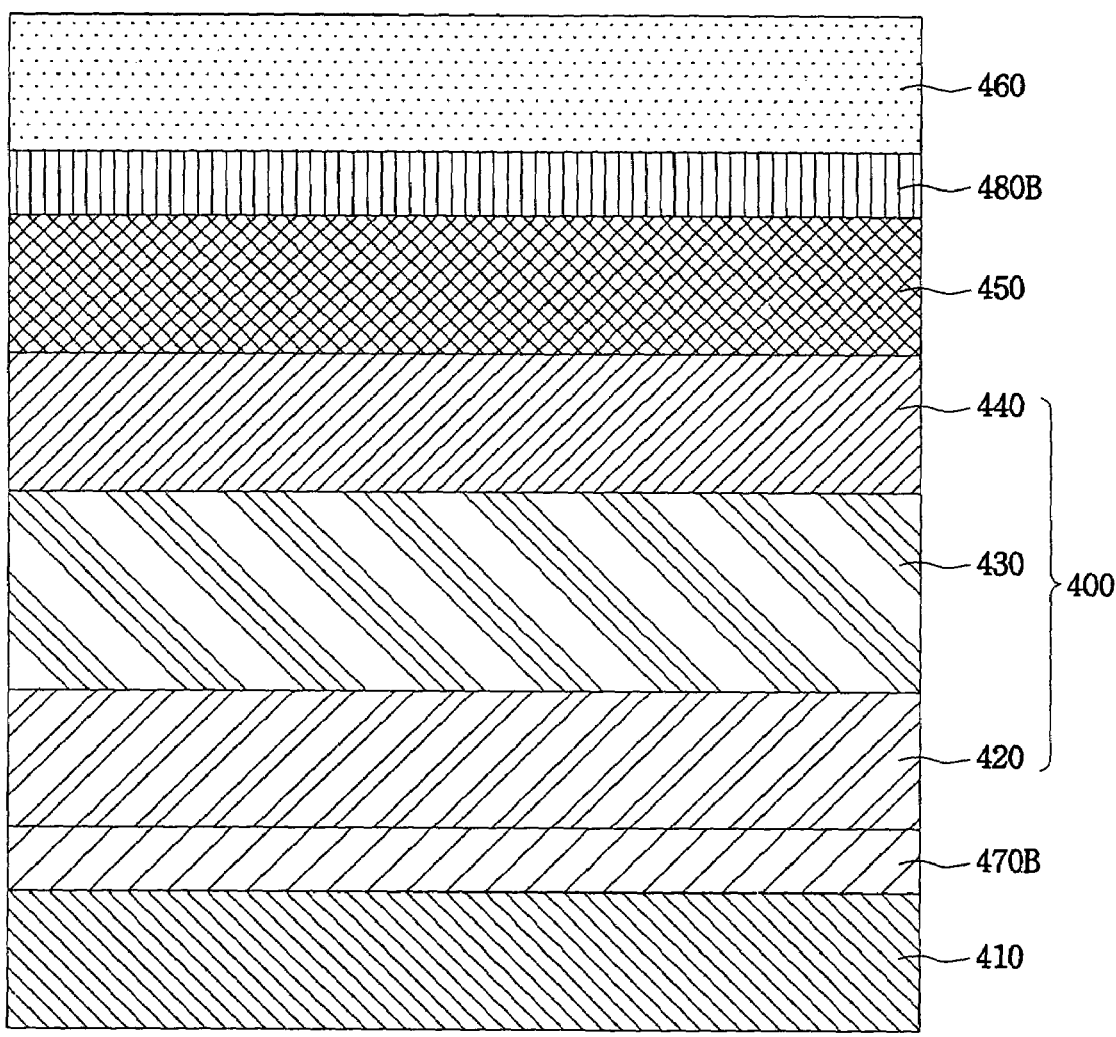
FIG. 8 shows a cross-sectional structure of a double-sided organic light emitting device according to an eighth embodiment of the invention.

FIG. 8 shows a cross-sectional structure of a double-sided organic light emitting device according to an eighth embodiment of the invention. As in the seventh embodiment, the organic light emitting device according to the eighth embodiment has a structure where lower and upper polarizing elements 470B and 480B are arranged on the inner surfaces of lower and the upper substrates 410 and 460, respectively.

Here, the lower polarizing element 470B and the upper polarizing element 480B are polarizing plates, which are bonded on the inner surfaces of the lower and upper substrates 410 and 460, respectively. The polarizing plates 470B and 480B are formed by bonding a polarizing film between about 50 to 300 µm in thickness on each inner surface of the lower and upper substrates 410 and 460. In this case, both the lower polarizing element 470B bonded on the inner surface of the lower substrate 410 and the upper polarizing element 480B bonded on the inner surface of the upper substrate 460 are preferably bonded in such a manner that their polarization axes are perpendicular to each other.

In the eighth embodiment, the lower and upper polarizing elements are formed by bonding the lower and upper polarizing films 470B and 480B on the inner surfaces of the lower and upper substrates 410 and 460, and then the emission element 400 is formed on the lower polarizing element 470B and is encapsulated with the upper substrate. Thereby, the organic light emitting device can be fabricated.

In the double-sided organic light emitting device according to the first embodiment of the invention, a principle of blocking external light will be described below with reference to FIGS. 9A and 9B.

Figure 9A:
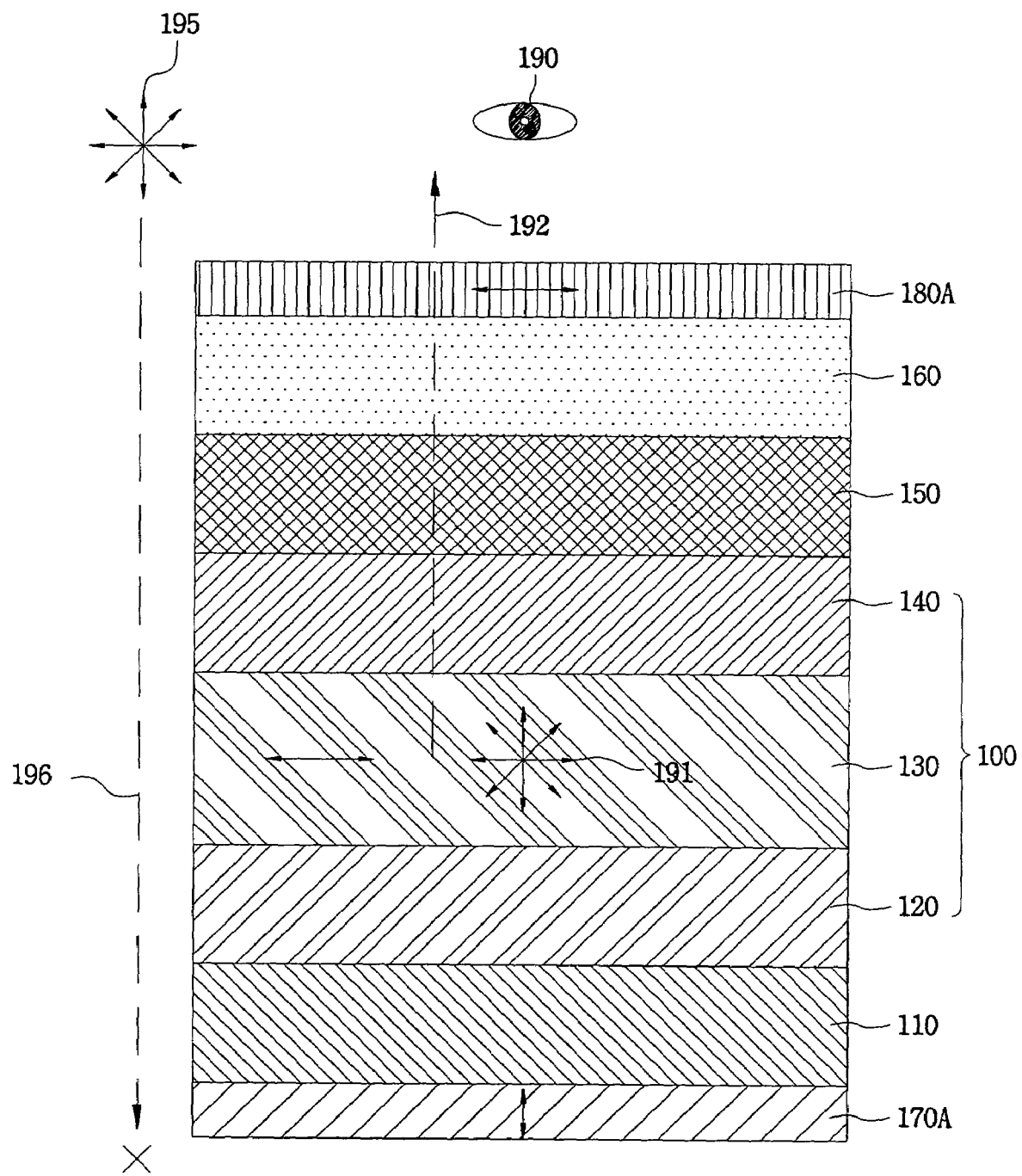
FIGS. 9A and 9B are views explaining a principle of blocking external light in the double-sided organic light emitting device according to the first embodiment of the invention.

As shown in FIG. 9A, when an observer 190 looks on the side of the encapsulating substrate 160 as the upper substrate, internal light 191 emitted from the EL layer 130 is linearly polarized through the upper polarizing element 180A to travel in an arrow direction 192, so that the observer 190 sees the light through the upper substrate 160. The linearly polarized internal light oscillates in the same direction as the polarization axis of the polarizing element 180A.

Meanwhile, external light 195 which is incident from the observer 190 to the encapsulating substrate 160 is linearly polarized through the upper polarizing element 180A to travel in an arrow direction 196. Internal transmitted light which is linearly polarized through the upper polarizing element 180A is reflected by a layer structure of the EL element 100, and the reflected external light is linearly polarized in a different direction to cross 90 degrees with an incident angle of the light which is incident through the encapsulating substrate 160, thus failing in transmission.

Further, in the case of another external light which is incident at a position opposite to the observer 190, namely, transmitted external light which is incident on and transmitted through the insulating substrate 110, it is linearly polarized through the lower polarizing element 170A. Here, the polarization axes of the lower and upper polarizing elements 170A and 180A are arranged perpendicular to each other, so that the transmitted external light which has been linearly polarized does not pass through the upper polarized element 180A. In other words, in the case of the transmitted external light, its polarization axis when it has been linearly polarized is perpendicular to its polarization axis when it has been incident on the insulating substrate 110. As a result, the transmitted external light passing through the lower substrate 110 at the position opposite to the observer 190 is blocked without being emitted through the upper polarizing element 180A.

Figure 9B:
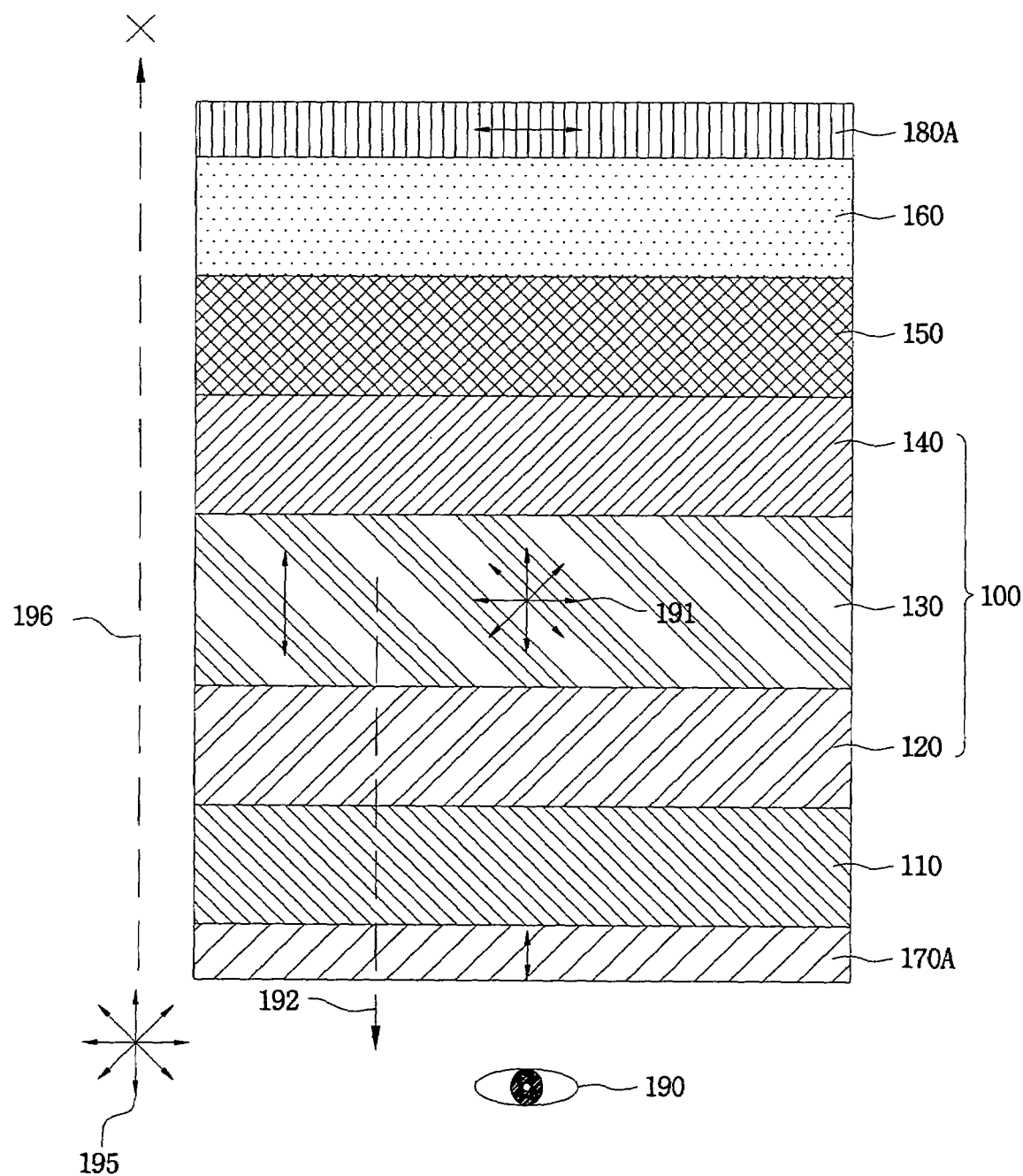

As shown in FIG. 9B, when the observer 190 looks on the side of the insulating substrate 110 as the lower substrate, internal light 191 emitted from the EL layer 130 is linearly polarized through the lower polarizing element 170A to travel in the arrow direction 192, so that the observer 190 sees the light through the lower substrate 110. The linearly polarized internal light oscillates in the same direction as the polarization axis of the lower polarizing element 170A.

Meanwhile, external light 195 that is incident from the observer 190 to the insulating substrate 110 is linearly polarized through the lower polarizing element 170A to travel in an arrow direction 196. Internal transmitted light which is linearly polarized through the lower polarizing element 170A is reflected by the layer structure of the EL element 100, and the reflected external light is linearly polarized in a different direction to cross 90 degrees with an incident angle of the light which is incident through the insulating substrate 110, thus failing in transmission.

Further, in the case of another external light which is incident at a position opposite to the observer 190, namely, transmitted external light which is incident on and transmitted through the encapsulating substrate 160, it is linearly polarized through the upper polarizing element 180A. Here, the polarization axes of the lower and upper polarizing elements 170A and 180A are arranged perpendicular to each other, so that the transmitted external light which has been linearly polarized does not pass through the lower polarized element 170A. In other words, in the case of the transmitted external light, its polarization axis when it has been linearly polarized is perpendicular to its polarization axis when it has been incident on the encapsulating substrate 160. As a result, the transmitted external light passing through the encapsulating substrate 160 at the position opposite to the observer 190 is blocked without being emitted through the lower polarizing element 170A.

Here, the reflected external light refers to light which is incident on the encapsulating substrate 160 to travel toward the insulating substrate 110 and is reflected through the internal emission element 100 to travel toward the encapsulating substrate 160 again, or which is incident on the insulating substrate 110 to travel toward the encapsulating substrate 160 and is reflected through the internal emission element 100 to travel toward the insulating substrate 110 again. Further, the transmitted external light refers to light which is incident through the encapsulating substrate 160 to travel toward the insulating substrate 110, or which is incident through the insulating substrate 110 to travel toward the encapsulating substrate 160.

As set forth above, on whichever side of the lower and upper substrates the observer 190 looks, only the light emitted from the emission layer 120 is allowed to pass through the lower or upper substrate 110 or 160, but the reflected or transmitted external light is not allowed to pass through the lower or upper substrate 110 or 160, thus being dissipated. Consequently, it is possible to realize a double-sided light emitting structure in which a contrast is prevented from being deteriorated by the external light.

The principle of blocking the external light has been described in connection with the double-sided organic light emitting device of the first embodiment with reference to FIGS. 9A and 9B, but is not limited to it. Therefore, as in the first to eighth embodiments, in the case where the lower polarizing element is arranged on any one of inner and outer surfaces of the lower substrate and the lower and the upper polarizing elements are arranged on any one of inner and outer surfaces of the upper substrates so that the polarization axis of the lower polarizing element is perpendicular to that of the upper polarizing element, it is possible to accomplish the above-mentioned effects of blocking the external light. Furthermore, the principle of blocking external light according to the first to eighteen embodiments of the invention may be applicable to display devices including other emission elements.

Figure 10:
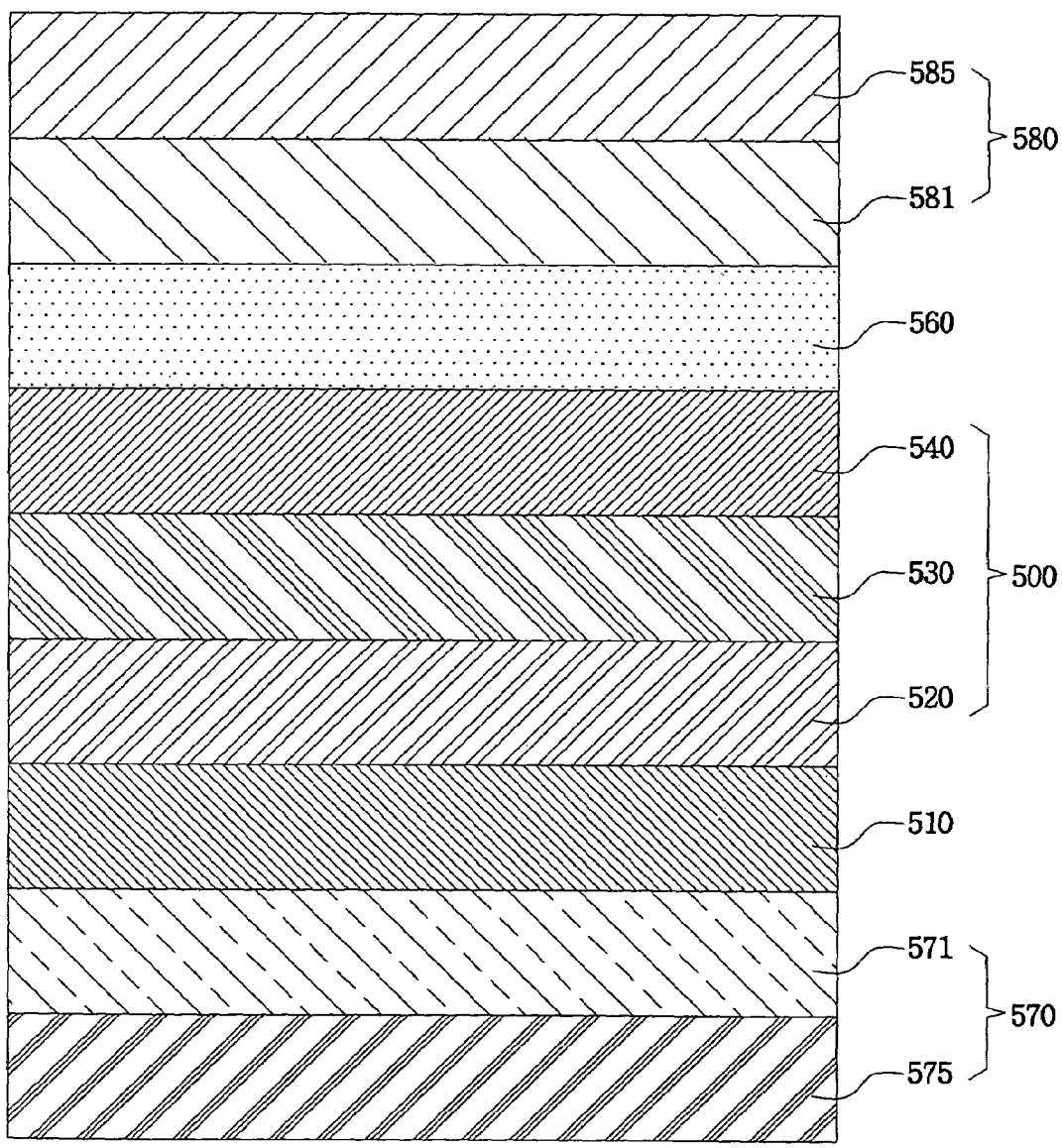
FIG. 10 shows a cross-sectional structure of a double-sided organic light emitting device according to a ninth embodiment of the invention.

FIG. 10 shows a cross-sectional structure of a double-sided organic light emitting device according to a ninth embodiment of the invention.

Referring to FIG. 10, there is a transparent lower insulating substrate 510, such as a glass substrate, on which a lower electrode 520 as an anode electrode is formed. An organic thin layer 530 and an upper electrode 540 as a cathode electrode are formed on the lower electrode 520. The lower electrode 520 functions as the anode electrode, which forms a transmission electrode consisting of a transparent conductive layer of ITO (Indium Tin Oxide), IZO (Indium Zinc Oxide) or so forth. The organic thin layer 530 includes at least one selected from a hole injecting layer (HIL), a hole transporting layer (HTL), an emission layer, a hole blocking layer (HBL), an electron transporting layer (ETL) and an electron injecting layer (EIL). The upper electrode 540 functions as the cathode electrode, which is formed by a metal layer of Ca, LiF or so forth which has a low work function. In this manner, the lower electrode 520, the organic thin layer 530 and the upper electrode 540 constitute an EL element 500.

A transparent encapsulating substrate 560 such as the glass substrate is bonded and encapsulated to the lower substrate 510 using a sealant (not shown). Lower and upper circular-polarizing plates 570 and 580 are disposed on outer surfaces of the lower and encapsulating substrates 510 and 560, respectively. The lower circular-polarizing plate 570 includes a lower linear-polarizing plate 575 and a lower compensating plate 571. The lower compensating plate 571 makes use of a λ/4 compensating plate. Similarly, the upper circular-polarizing plate 580 includes an upper linear-polarizing plate 585 and an upper compensating plate 581. The upper compensating plate 581 makes use of a λ/4 compensating plate.

In the double-sided organic light emitting device having a configuration as set forth above, when each phase difference retardation value, of the lower and upper compensating plates 571 and 581 is denoted by x, the phase difference retardation value, x, satisfies the following expression.

$$n\lambda/2 \leq x \leq (n+1)\lambda/2,$$

where n is an integer number.

Thus, the double-sided organic light emitting device of the present invention can block the external light regardless of the direction in which the observer looks. Further, when the external light is reflected inside the emission element 500, the reflected external light can be blocked. Thus, the double-sided organic light emitting device of the present invention has a high contrast.

A principle of blocking the external light in the double-sided organic light emitting device according to the ninth embodiment of the invention will be described below with reference to FIGS. 14A and 14B.

First, in the case where an observer 590 looks on the side of the encapsulating substrate 560, internal light emitted from the emission layer 530 is seen through the upper circular-polarizing plate 580. External light 595 which is incident from the observer 590 to the encapsulating substrate 560 is circularly polarized through the linear-polarizing plate 585 and the compensating plate 581 to travel in an arrow direction 596.

In this manner, the external light circularly polarized through the upper circular-polarizing plate 580 is reflected by a layer structure of the EL element 500 and is circularly polarized in a different direction. Here, the left circularly polarized light is converted into a right circularly polarized light. Then, the right circularly polarized light is converted into a linear-polarized light by the upper compensating plate 581. Here, the linear-polarized light converted by the upper compensating plate 581 crosses 90 degrees with an incident angle of the light which is initially incident through the encapsulating substrate 560, thus failing in transmission.

Meanwhile, in the case of another external light which is incident at a position opposite to the observer 590, namely, transmitted external light which is incident on and transmitted through the insulating substrate 510, if each of the lower and upper compensating plates 571 and 581 has a phase difference retardation axis of $\lambda/4$, and if a crossing angle between the phase difference retardation axis of the upper compensating plate 581 and a polarization axis of the upper polarizing plate 585 is opposite to a crossing angle between the phase difference retardation axis of the lower compensating plate 571 and a polarization axis of the lower polarizing plate 575, the transmitted external light which passes through the insulating substrate 510 fails to be transmitted to the observer 590 regardless of angles between the upper polarizing plate 585 and the lower and upper compensating plates 571 and 581 and between the lower polarizing plate 575 and the lower and upper compensating plates 571 and 581.

For example, as in FIG. 14A, when the linear-polarizing plate 585 of the upper circular-polarizing plate 580 and the linear-polarizing plate 575 of the lower circular-polarizing plate 570 are arranged so that their polarization axes are parallel to each other, the transmitted external light 596 incident on and transmitted through the insulating substrate 510 is circularly polarized through the linear-polarizing plate 575 and the compensating plate 571 which constitute the lower circular-polarizing plate 570, and then travels toward the encapsulating substrate 560.

In this case, because the phase difference delay axes of the lower and upper compensating plates 571 and 581 are equal to each other, the transmitted external light is shifted twice by $\lambda/4$ in the same direction, consequently by a total of $\lambda/2$, and is transformed into linearly polarized light. In the case of the transmitted external light, its polarization axis after it is linearly polarized is perpendicular to its polarization axis before it is linearly polarized, i.e., when it is incident on the insulating substrate 510. As a result, the transmitted external light passing through the insulating substrate 510 at the position opposite to the observer 590 is blocked without being emitted through the upper circular-polarizing plate 580.

Figure 14B:
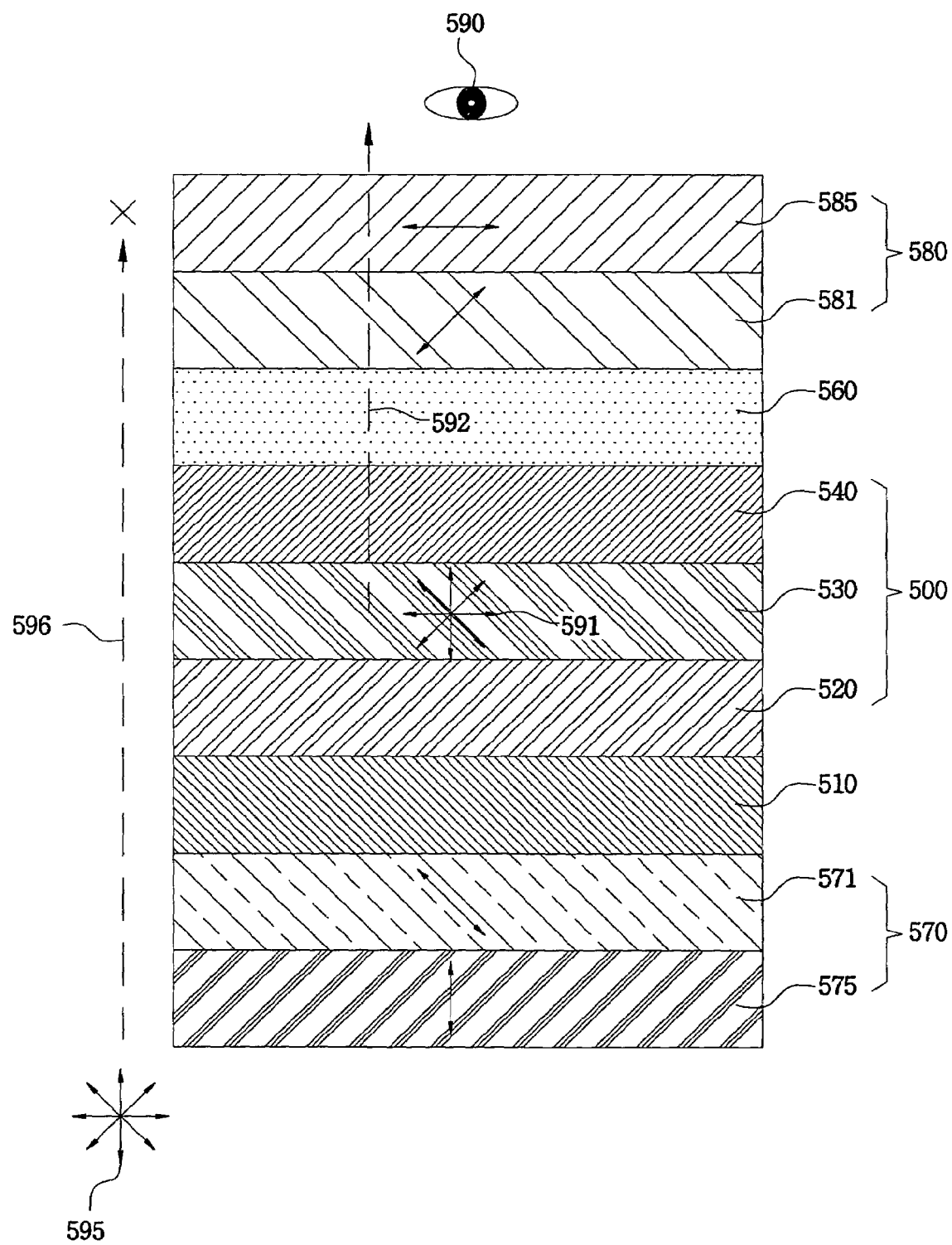

As in FIG. 14B, even when the linear-polarizing plate 585 of the upper circular-polarizing plate 580 and the linear-polarizing plate 575 of the lower circular-polarizing plate 570 are arranged so that their polarization axes are perpendicular to each other, external light which is incident through the encapsulating substrate 560 and is reflected through the EL element 500, i.e., reflected external light is blocked as well according to the same principle as in FIG. 14A.

Further, the external light incident on the side of the insulating substrate 510 passes through the insulating substrate 510, i.e., the transmitted external light is circularly polarized through the linear-polarizing plate 575 and the compensating plate 571 which constitute the lower circular-polarizing plate 570, and then travels toward the encapsulating substrate 560. In this case, because the phase difference retardation axes of the lower and upper compensating plates 571 and 581 are perpendicular to each other, the transmitted incident light is linearly polarized in the same direction as the direction when passing through the insulating substrate 510, the upper linear-polarizing plate 585 on the side of the encapsulating substrate is perpendicular to the lower linear-polarizing plate 575, so that the transmitted external light passing through the insulating substrate 510 is blocked without being emitted toward the observer 590 through the upper circular-polarizing plate 580.

Here, the reflected external light refers to light which is incident on the encapsulating substrate 560 to travel toward the insulating substrate 510 and is reflected through the internal EL element 500 to travel toward the encapsulating substrate 560 again, or which is incident on the insulating substrate 510 to travel toward the encapsulating substrate 560 and is reflected through the internal EL element 500 to travel toward the insulating substrate 510 again. Further, the transmitted external light refers to light which is incident through the encapsulating substrate 560 to travel toward the insulating substrate 510, or which is incident through the insulating substrate 510 to travel toward the encapsulating substrate 560.

As a result, only the light 591 emitted from the emission layer 530 is seen to the observer 590, but the external light incident on the side of the encapsulating substrate is blocked. Therefore, although the light is emitted from the emission layer 530 in both opposite directions, a background on the side of the insulating substrate is not projected, so that the observer 590 can recognize only the light emitted from the emission layer 530. This allows a definition of image quality to be improved.

For this reason, in the double-sided organic light emitting device of the invention, with regard to the transmitted external light which is incident from the direction opposite to the observer 590, it is preferable that the crossing angles between the retardation axes of the lower and upper compensating plates 571 and 581 and the polarization axes of the lower and upper linear-polarized plates 575 and 585 become rotational angles opposite to each other at the lower and upper substrates.

Figure 11:
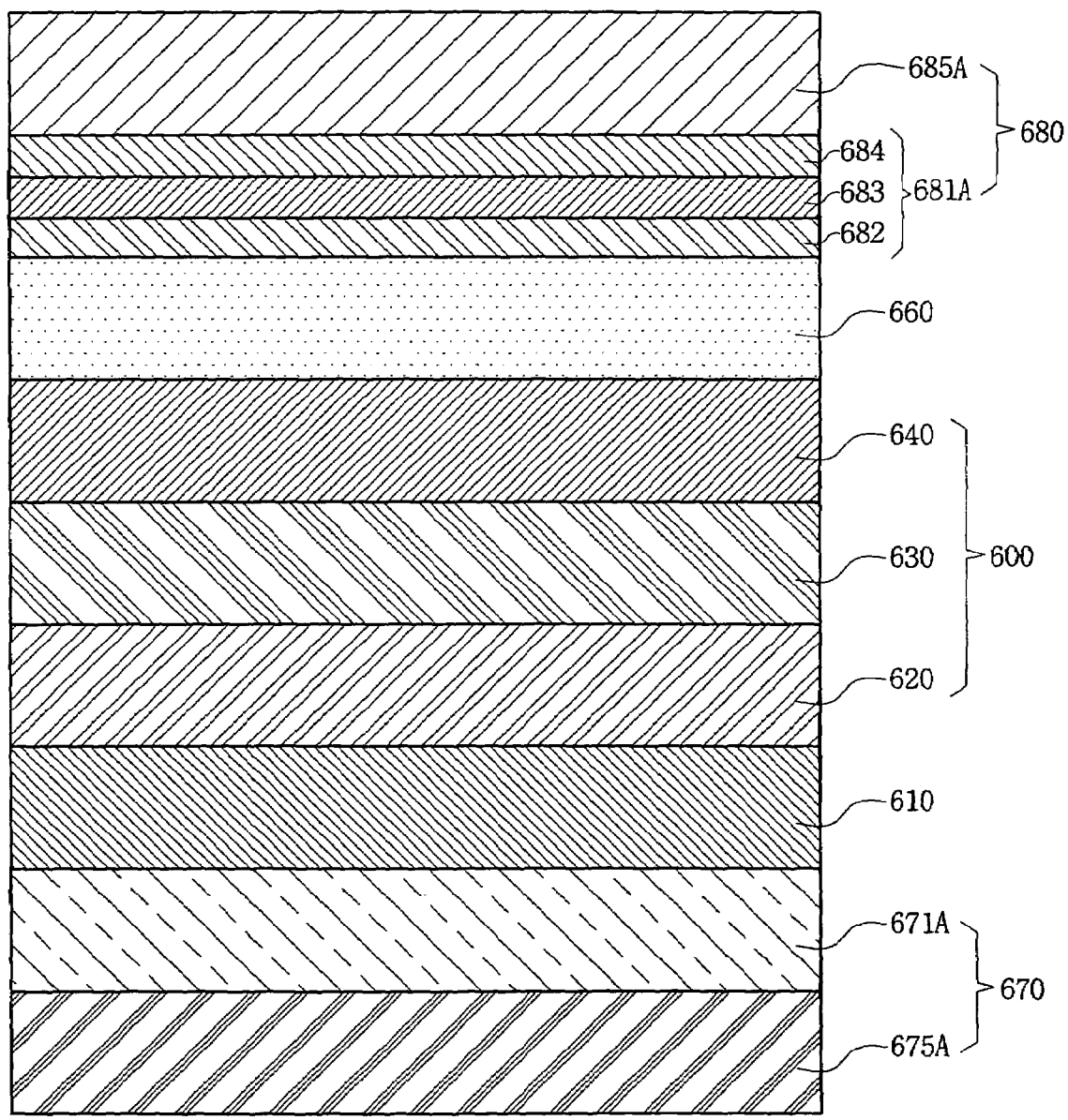
FIG. 11 shows a cross-sectional structure of a double-sided organic light emitting device according to a tenth embodiment of the invention.

FIG. 11 shows a cross-sectional structure of a double-sided organic light emitting device according to a tenth embodiment of the invention.

Referring to FIG. 11, the double-sided organic light emitting device of the tenth embodiment is similar to that of the ninth embodiment except for a compensating plate. Specifically, the compensating plate is configured of one $\lambda/4$ compensating plate in the first embodiment, but a plurality of compensating films in the tenth embodiment, each of which has a phase difference retardation axis and functions as the $\lambda/4$ compensating plate.

In the double-sided organic light emitting device according to the tenth embodiment, there is a lower insulating substrate 610, on which a lower electrode 620 is formed. An organic thin layer 630 and an upper electrode 640 are formed on the lower electrode 620. An encapsulating substrate 660 is bonded and encapsulated to the lower substrate 610 using a sealant. Lower and upper circular-polarizing plates 670 and 680 are disposed on outer surfaces of the lower and encapsulating substrates 610 and 660, respectively. The lower circular-polarizing plate 670 includes a lower linear-polarizing plate 675A and a lower compensating plate 671A. The lower compensating plate 671A makes use of the λ/4 compensating plate. Similarly, the upper circular-polarizing plate 680 includes an upper linear-polarizing plate 685A and an upper compensating plate 681A. The upper compensating plate 681A makes use of the plurality of compensating films 682-684 so as to function as the λ/4 compensating plate. Here, the compensating films 682 through 684 have their phase difference retardation axes which are equal to or different from each other.

Figure 12:
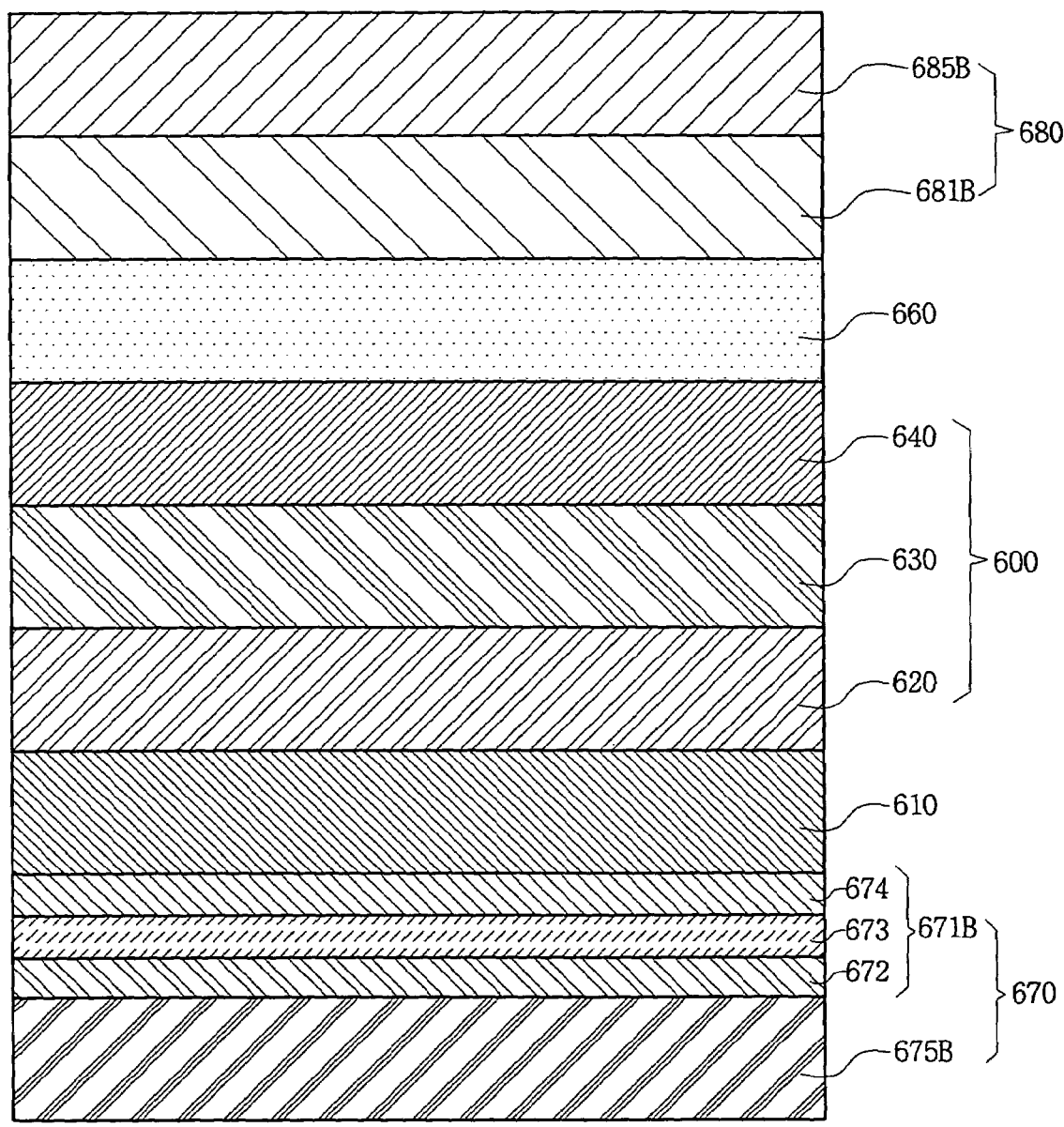
FIG. 12 shows a cross-sectional structure of a double-sided organic light emitting device according to an eleventh embodiment of the invention.

FIG. 12 shows a cross-sectional structure of a double-sided organic light emitting device according to an eleventh embodiment of the invention.

Referring to FIG. 12, the double-sided organic light emitting device of the eleventh embodiment is similar to that of the ninth embodiment except for a compensating plate 671B of the lower circular-polarizing plate 670. Specifically, the compensating plate 671B is configured of one λ/4 compensating plate in the ninth embodiment, but a plurality of compensating films 672 through 674 in the eleventh embodiment, each of which has a phase difference retardation axis and functions as the λ/4 compensating plate.

Figure 13:
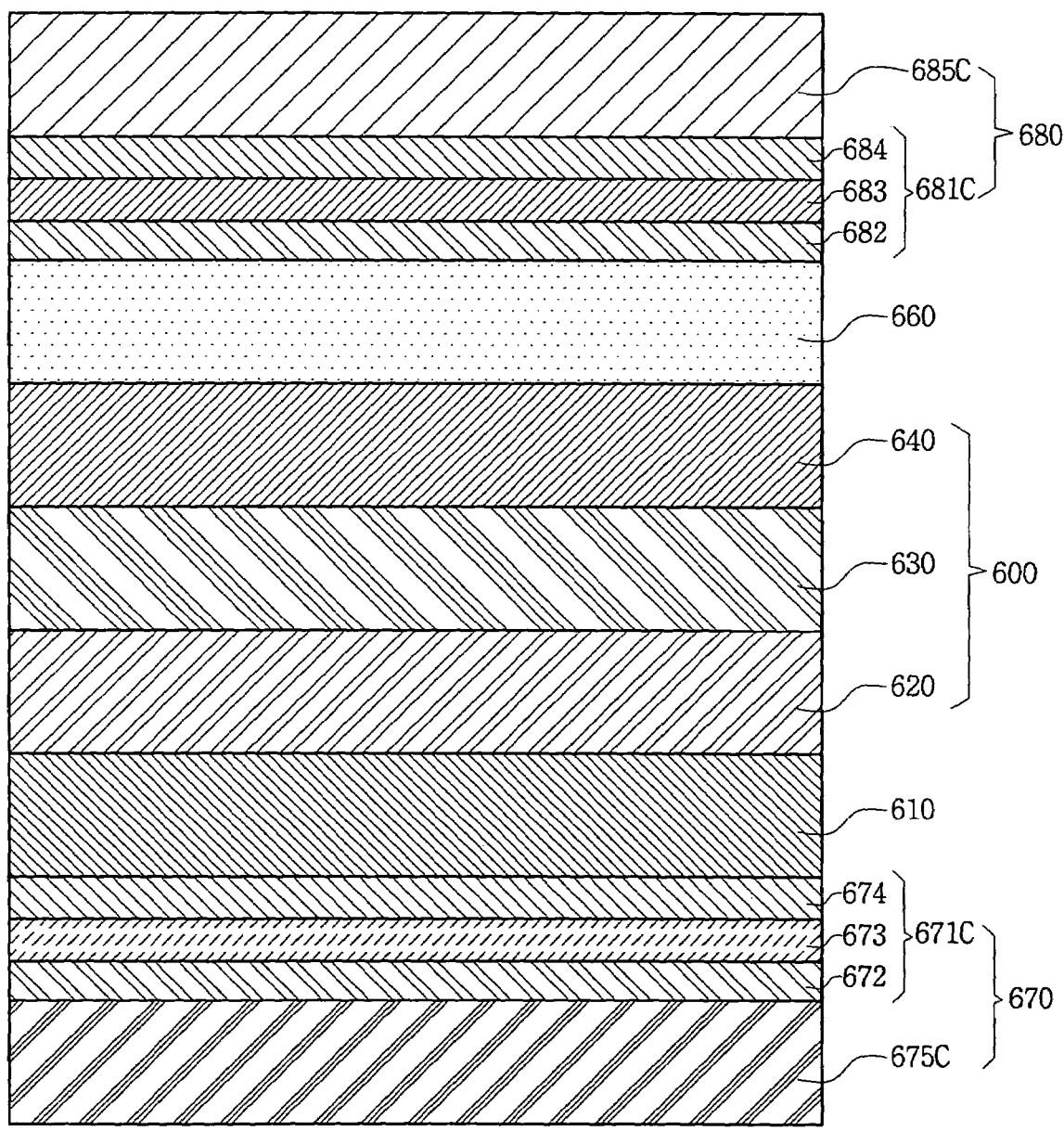
FIG. 13 shows a cross-sectional structure of a double-sided organic light emitting device according to a twelfth embodiment of the invention.

FIG. 13 shows a cross-sectional structure of a double-sided organic light emitting device according to a twelfth embodiment of the invention.

Referring to FIG. 13, the double-sided organic light emitting device of the twelfth embodiment is similar to that of the ninth embodiment except for compensating plates 671C and 681C of the lower and upper circular-polarizing plates 670 and 680, respectively. Specifically, each of the compensating plates 671C and 681C is configured of one λ/4 compensating plate in the ninth embodiment, but the plurality of compensating films 672 through 674; and 682 through 684 in the twelfth embodiment, each of which has a phase difference retardation axis and functions as the λ/4 compensating plate.

In the double-sided organic light emitting devices according to the tenth to twelfth embodiments shown in FIGS. 11 through 13 as in the ninth embodiment, when each phase difference retardation value, of the lower and upper compensating plates 671 and 681 is denoted by x, each phase difference retardation value x satisfies the following expression:

$$n\lambda/2 \leq x \leq (n+1)\lambda/2,$$

where n is an integer number.

Thus, as in the ninth embodiment, both transmitted external light and reflected external light are blocked based on the principle as shown in FIGS. 14A and 14B, so that it is possible to improve a definition of image quality.

Figure 15:
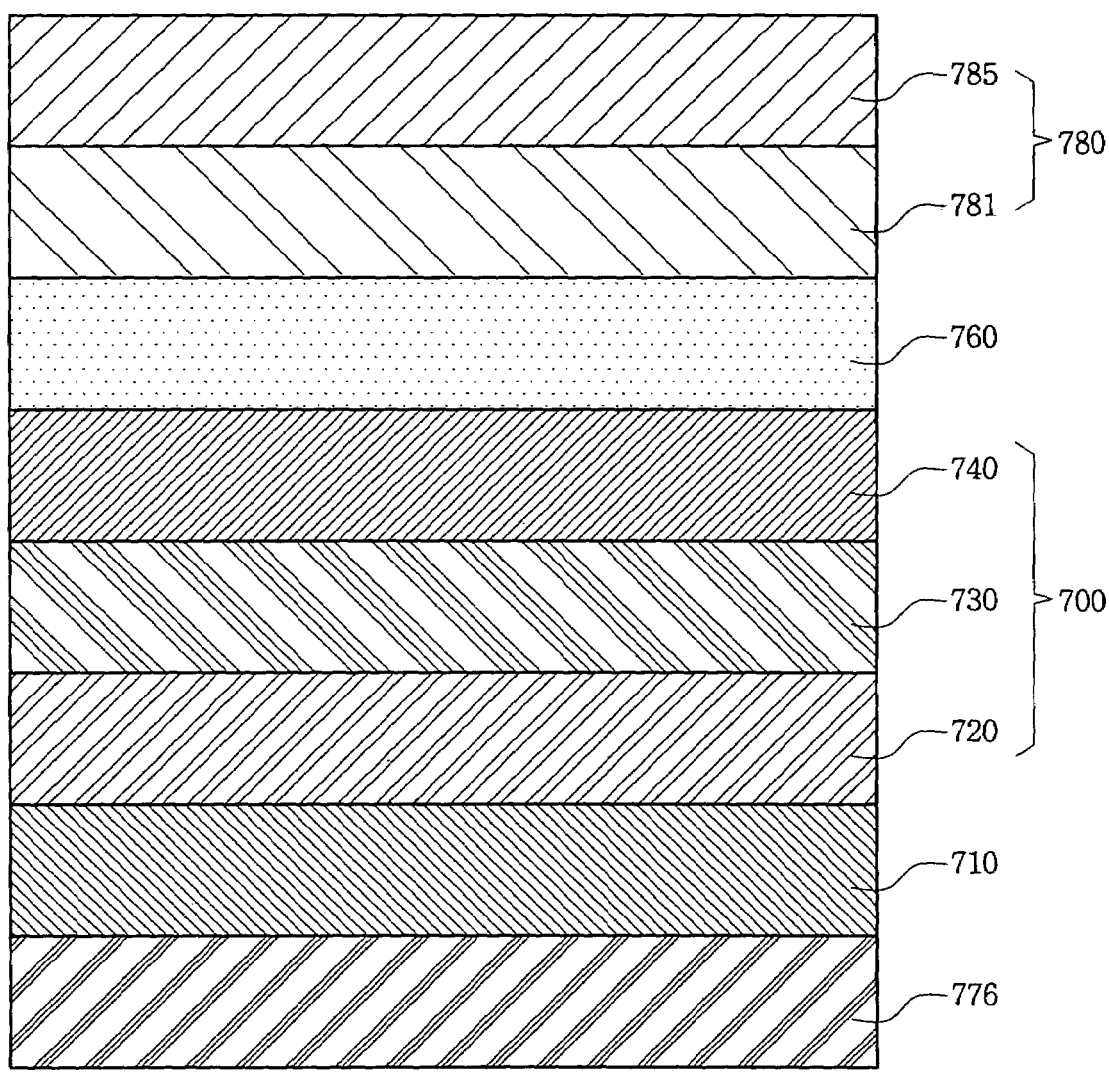
FIG. 15 shows a cross-sectional structure of a double-sided organic light emitting device according to a thirteenth embodiment of the invention.

FIG. 15 shows a cross-sectional structure of a double-sided organic light emitting device according to a thirteenth embodiment of the invention.

Referring to FIG. 15, the double-sided organic light emitting device of the thirteenth embodiment is similar to that of the ninth embodiment, but is applicable in the case that it is intended to improve effects of blocking light on the side of the encapsulating substrate rather than the lower substrate by providing the circular-polarizing plate only on the side of the encapsulating substrate.

In the double-sided organic light emitting device according to the thirteenth embodiment, there is a lower insulating substrate 710, on which a lower electrode 720 is formed. An organic thin layer 730 and an upper electrode 740 are formed on the lower electrode 720. An encapsulating substrate 760 is bonded and encapsulated to the lower substrate 710 using a sealant. Upper circular-polarizing plate 780 is disposed on outer surfaces of the encapsulating substrate 760, and lower linear-polarizing plate 776 is disposed on outer surfaces of the lower substrate 710. The circular-polarizing plate 780 includes a linear-polarizing plate 785 and a compensating plate 781. The compensating plate 781 makes use of the λ/4 compensating plate.

Figure 20A:
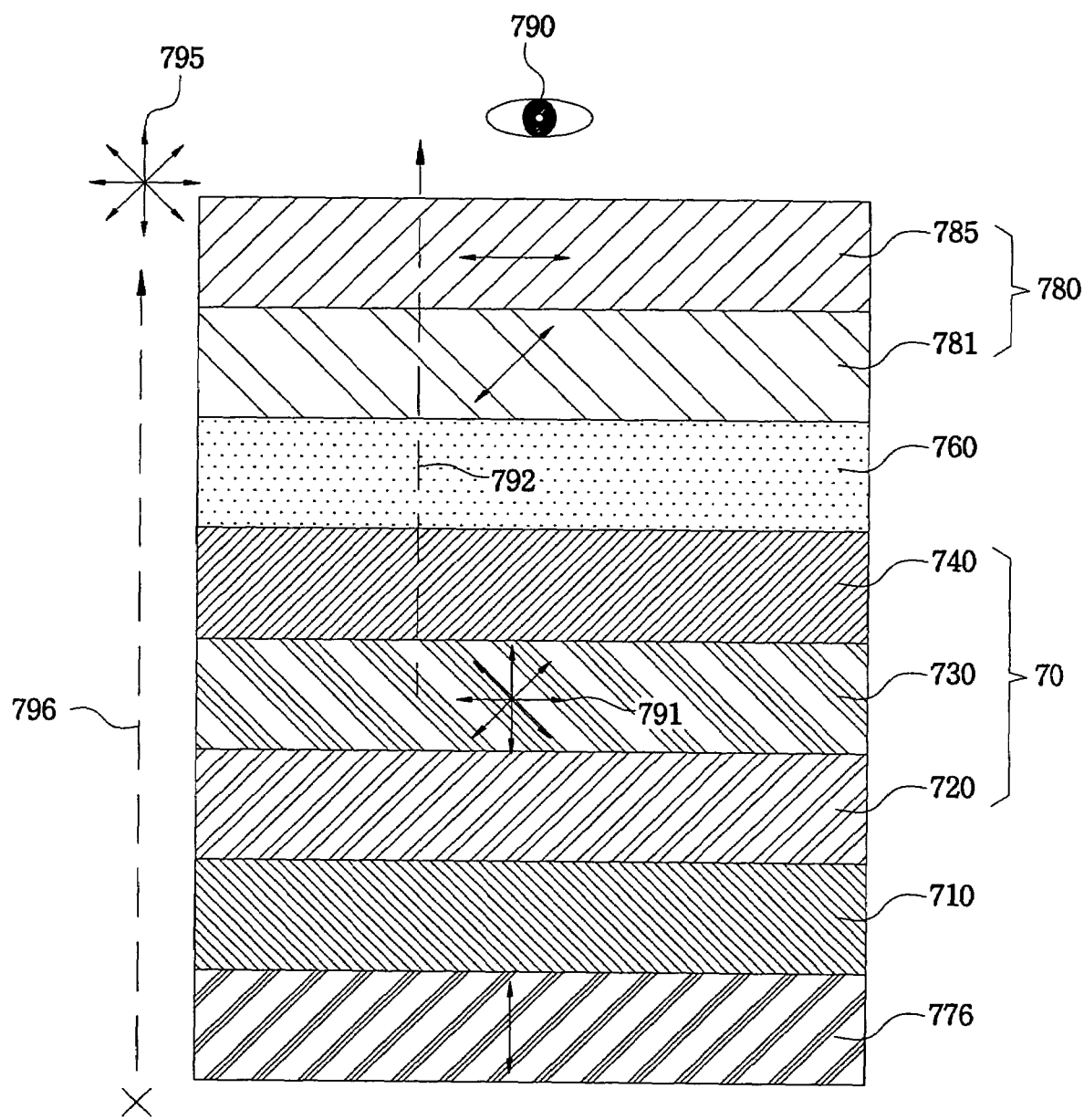
FIGS. 20A and 20B are views explaining a principle of blocking external light in the double-sided organic light emitting device according to the thirteenth embodiment of the invention.
Figure 20B:
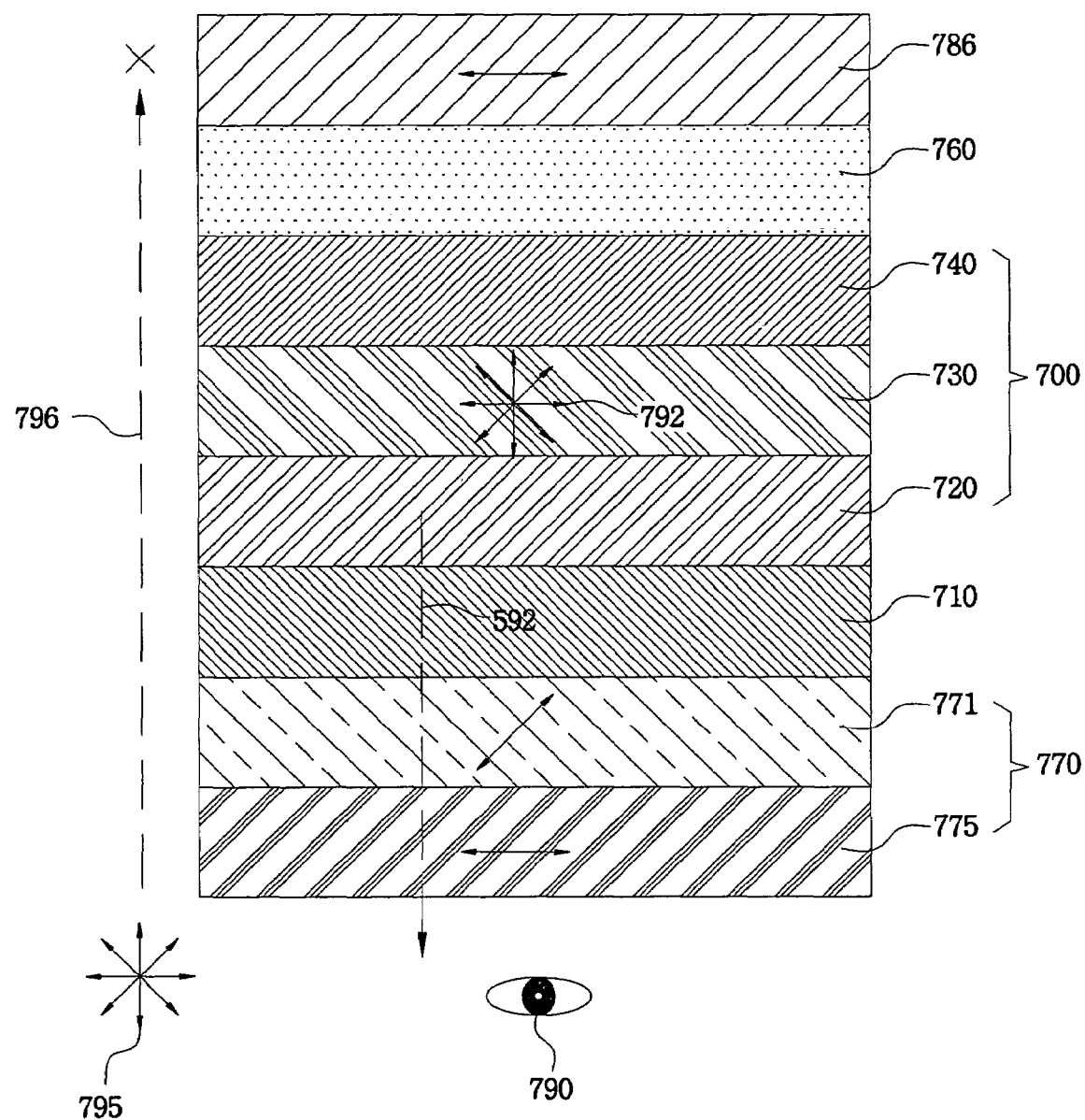

In the thirteenth embodiment shown in FIG. 15, as shown in FIGS. 20A and 20B, it is possible to accomplish effects of blocking not only external light incident only at a position of an observer 790, i.e. on the side of the encapsulating substrate but also reflected light of this external light.

Figure 16:
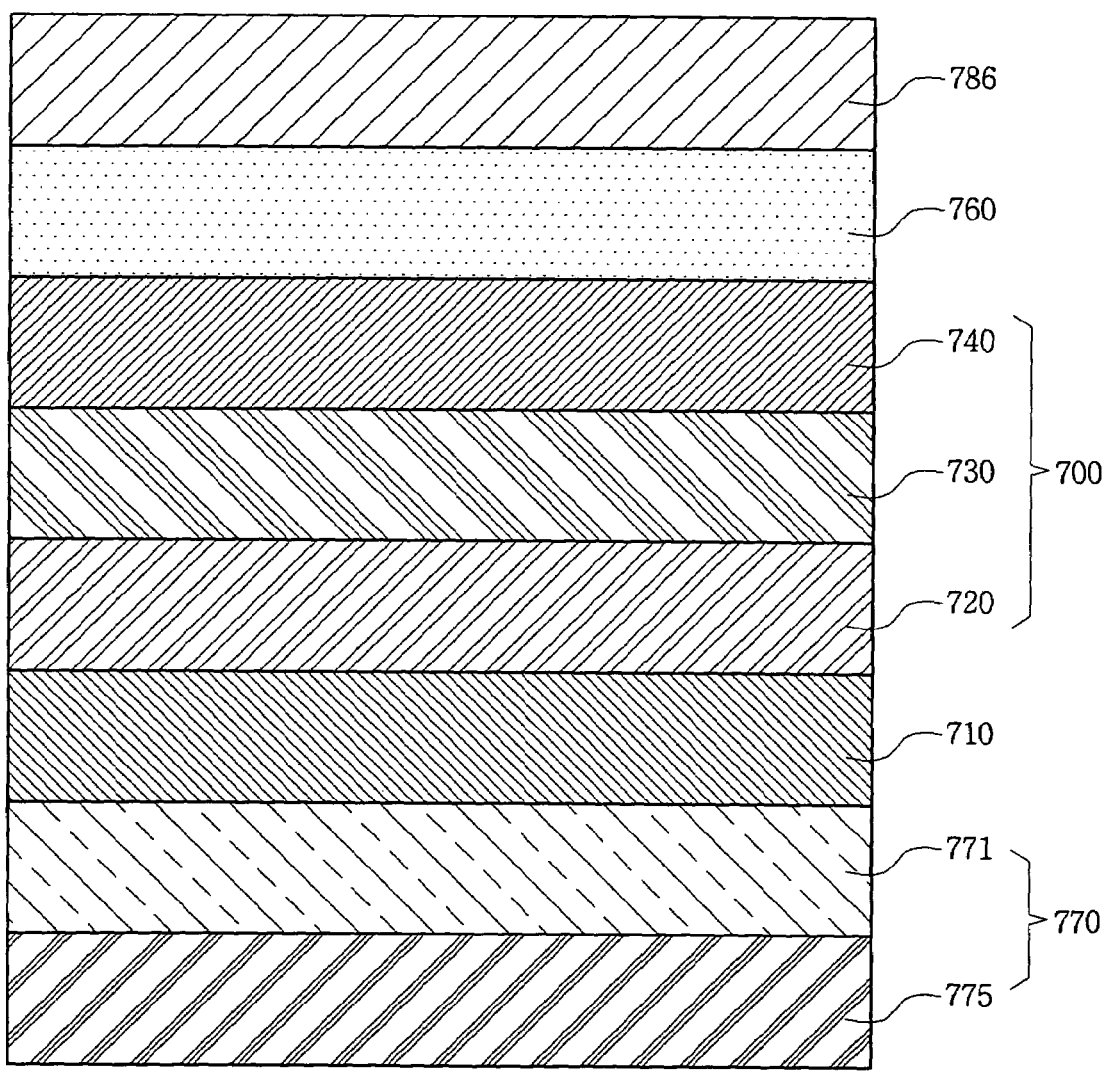
FIG. 16 shows a cross-sectional structure of a double-sided organic light emitting device according to a fourteenth embodiment of the invention.

FIG. 16 shows a cross-sectional structure of a double-sided organic light emitting device according to a fourteenth embodiment of the invention.

Referring to FIG. 16, the double-sided organic light emitting device of the fourteenth embodiment is similar to that of the thirteenth embodiment, but is different in that it is intended to improve effects of blocking light on the side of the lower substrate rather than the encapsulating substrate by providing the circular-polarizing plate only on the side of the lower substrate. A lower circular-polarizing plate 770 is configured of a linear-polarizing plate 775 and a compensating plate 771. The compensating plate 771 makes use of the λ/4 compensating plate. Thus, in the case where the observer 790 looks on the side of the lower substrate 710, it is possible to obtain effects of blocking not only external light incident only on the side of the lower substrate 710 but also reflected light of this external light.

Figure 17:
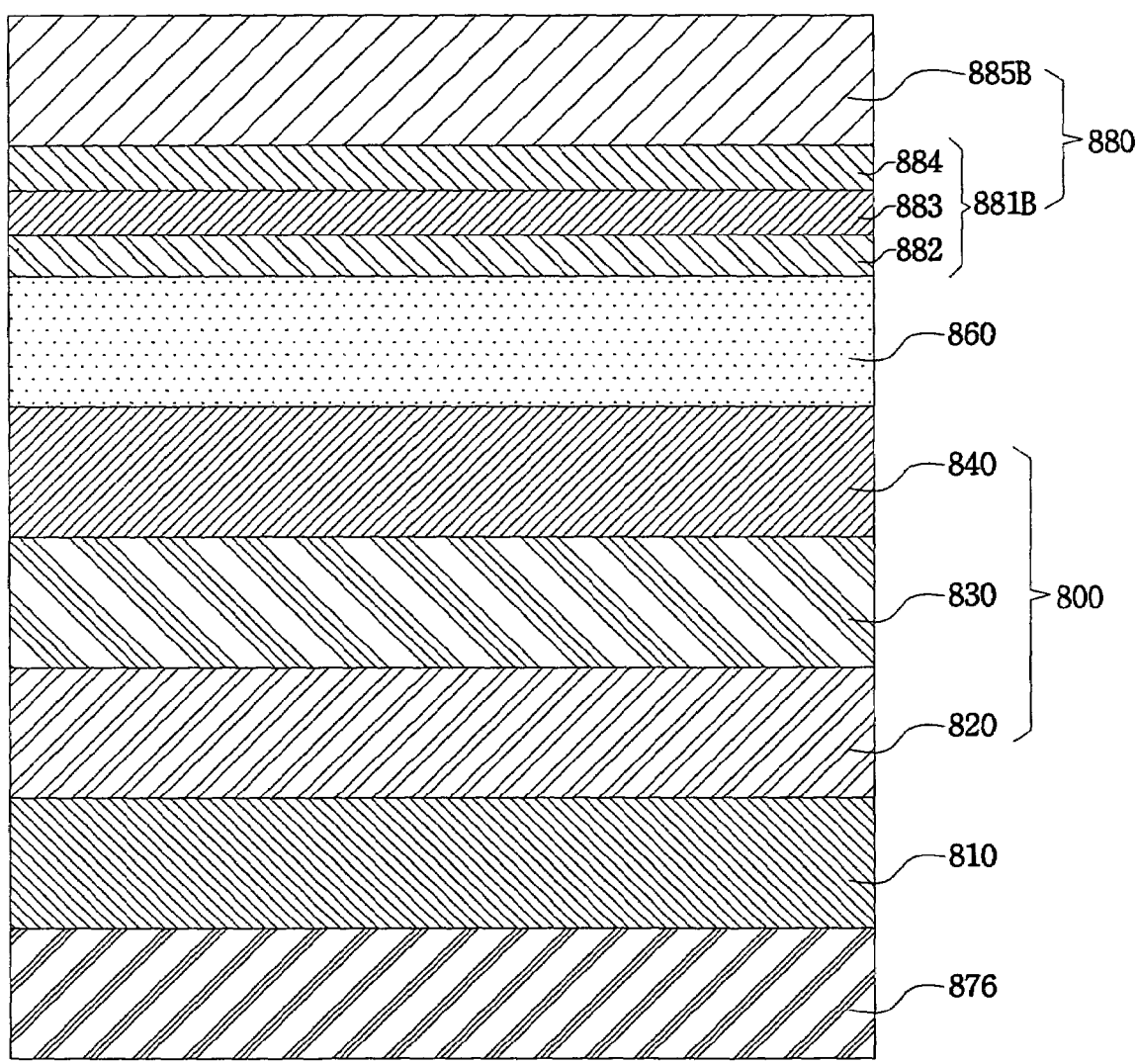
FIG. 17 shows a cross-sectional structure of a double-sided organic light emitting device according to a fifteenth embodiment of the invention.

FIG. 17 shows a cross-sectional structure of a double-sided organic light emitting device according to a fifteenth embodiment of the invention.

Referring to FIG. 17, the double-sided organic light emitting device of the fifteenth embodiment is similar to that of the thirteenth embodiment except that a compensating plate 881B of an upper circular-polarizing plate 880 is configured using a plurality of compensating films 882 through 884, each of which has a phase difference retardation axis.

Figure 18:
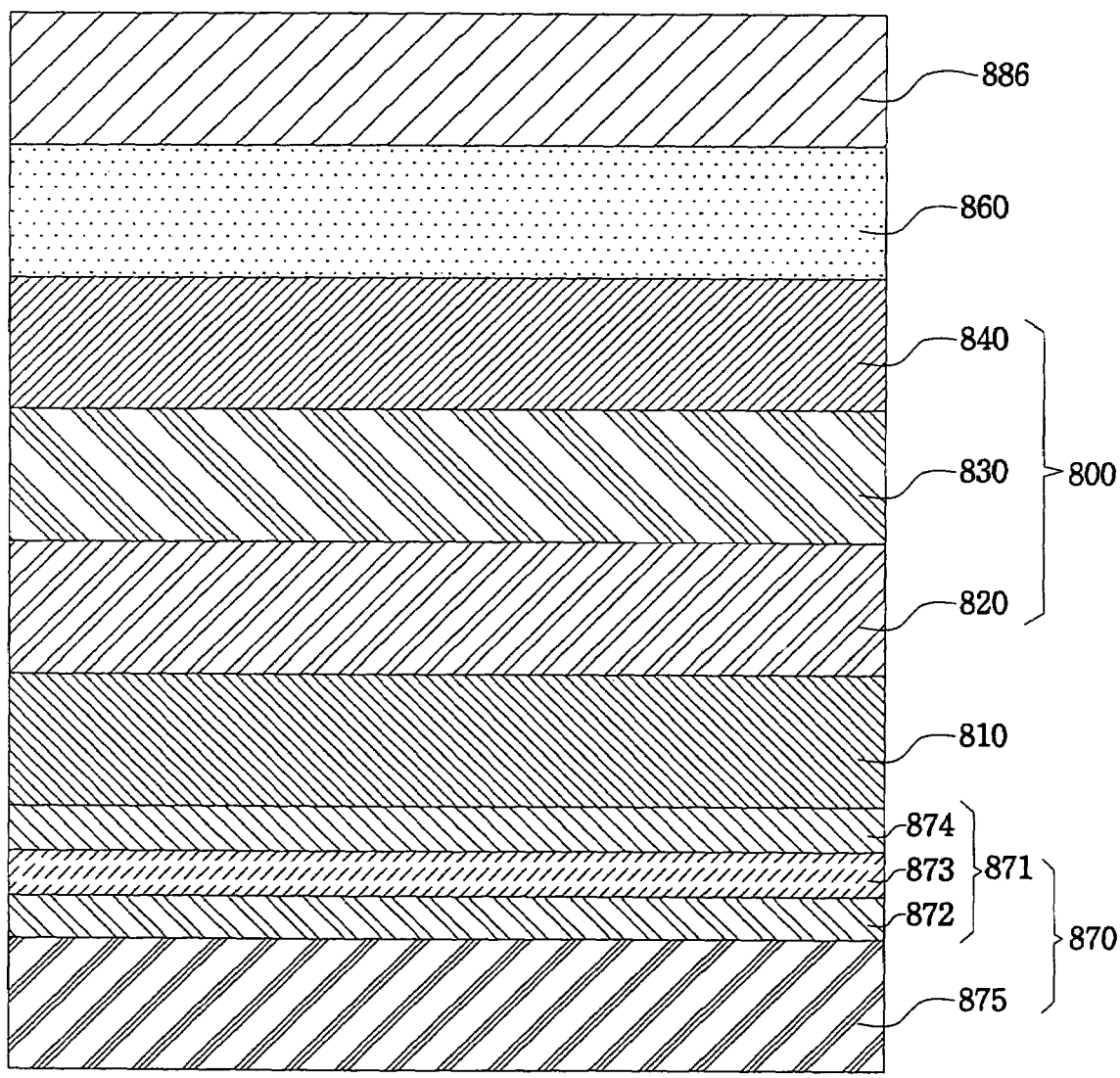
FIG. 18 shows a cross-sectional structure of a double-sided organic light emitting device according to a sixteenth embodiment of the invention.

FIG. 18 shows a cross-sectional structure of a double-sided organic light emitting device according to a sixteenth embodiment of the invention.

Referring to FIG. 18, the double-sided organic light emitting device of the sixteenth embodiment is similar to that of the fourteenth embodiment except that a compensating plate 871 of a lower circular-polarizing plate 870 is configured using a plurality of compensating films 872 through 874, each of which has a phase difference retardation axis.

Figure 19:
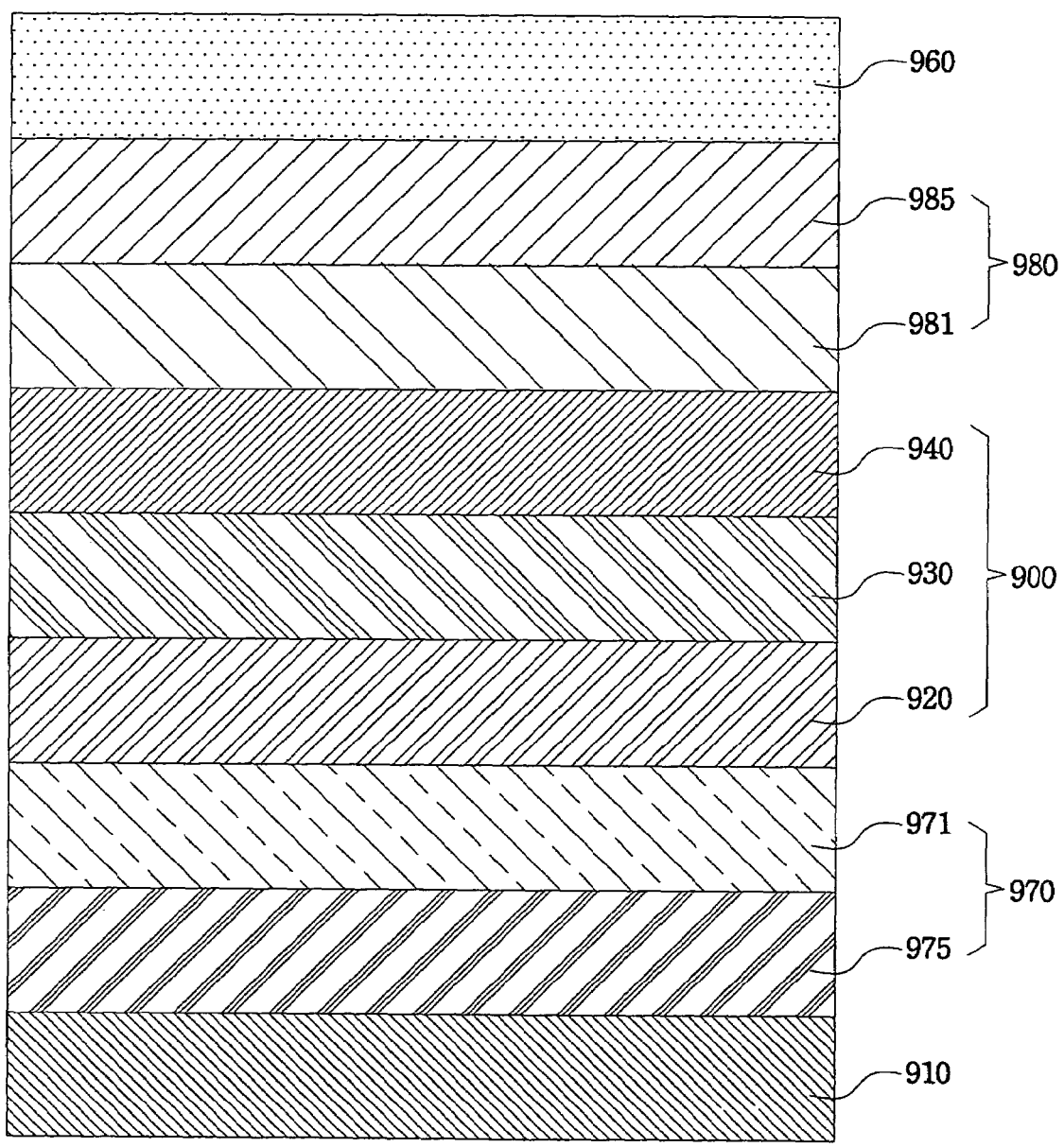
FIG. 19 shows a cross-sectional structure of a double-sided organic light emitting device according to a seventeenth embodiment of the invention.

FIG. 19 shows a cross-sectional structure of a double-sided organic light emitting device according to a seventeenth embodiment of the invention.

Referring to FIG. 19, the double-sided organic light emitting device of the seventeenth embodiment is similar to that of the ninth embodiment. However, in the case where polarizing plates 971 and 981 and compensating plates 975 and 985 which constitute circular-polarizing plates 970 and 980 are formed like a film or coating layer as the first or second embodiment, the circular-polarizing plates 970 and 980 are arranged on inner surfaces of lower and encapsulating substrates 910 and 960, respectively. Alternatively, among the polarizing plates 971 and 981 and the compensating plates 975 and 985 which constitute the circular-polarizing plates 970 and 980, the polarizing plates 971 and 981 may be arranged on outer surfaces of lower and encapsulating substrates 910 and 960 respectively, while the compensating plates 975 and 985 may be arranged on inner surfaces of lower and encapsulating substrates 910 and 960, respectively.

Further, alternatively, any one of the lower and upper linear-polarizing plates 971 and 981 may be formed on the inner surface of any one of the lower and encapsulating substrates 910 and 960, and the other polarizing plate may be formed on the outer surface of the other substrate. In addition, the lower and upper compensating plates may be disposed between the inner and outer surfaces of the substrates and emission layer.

The ninth to seventeenth embodiments of the invention has been illustrated regarding the double-sided organic light emitting device in which the circular-polarizing plates, each of which includes the linear-polarizing plate and the λ/4 compensating plate, are bonded on one side surfaces of the lower and upper substrates, thereby blocking both the transmitted external light and the reflected external light. However, this principle may be true of other emission elements. Further, the passivation layer may be additionally formed on the cathode electrode of the emission element.

As can seen from the foregoing, according to the invention, by bonding the polarizing plates on both opposite sides of the double-sided organic light emitting device to block the external light, it is possible to realize the double-sided organic light emitting device having a high contrast. Further, in the case that it is applied to a folder-type double-sided display device, the polarizing plates bonded on both surfaces of the glass substrate can not only block the external light but also function to protect the lower and upper insulating substrates, i.e., to resist a shock.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A double-sided light emitting device comprising:
   lower and upper substrates;
   an emission element formed between an inner surface of the upper substrate and an inner surface of the lower substrate and emitting predetermined light;
   an upper layer of polarizing material disposed on at least one of inner and outer surfaces of the upper substrate; and
   a lower layer of polarizing material disposed on at least one of inner and outer surfaces of the lower substrate,
   wherein the upper and lower layers of polarizing material are disposed so that polarization axes of the upper and lower layers of polarizing material are perpendicular to each other.

2. The double-sided light emitting device as claimed in claim 1, wherein the lower and upper layers of polarizing material are coating layers coated on the outer surfaces of the lower and upper substrates, respectively.

3. The double-sided light emitting device as claimed in claim 1, wherein the lower and upper layers of polarizing material are coating layers coated on the inner surfaces of the lower and upper substrates, respectively.

4. The double-sided light emitting device as claimed in claim 1, wherein the upper layer of polarizing material is a coating layer coated on the inner surface of the upper substrate, and the lower layer of polarizing material is a coating layer coated on the outer surface of the lower substrate.

5. The double-sided light emitting device as claimed in claim 1, wherein the upper layer of polarizing material is a coating layer coated on the outer surface of the upper substrate, and the lower layer of polarizing material is a coating layer coated on the inner surface of the lower substrate.

6. The double-sided light emitting device as claimed in claim 1, wherein the lower and upper layers of polarizing material are disposed on ones of inner and outer surfaces of the lower and upper substrates respectively.

7. The double-sided light emitting device as claimed in claim 1, wherein the lower and upper layers of polarizing material each are a coating layer having a thickness from about 0.1 µm to 50.0 µm.

8. A double-sided light emitting device comprising:
   lower and upper substrates;
   an emission element formed between an inner surface of the upper substrate and an inner surface of the lower substrate and emitting predetermined light;
   an upper polarizing plate disposed on any one of inner and outer surfaces of the upper substrate; and
   a lower polarizing plate disposed on any one of inner and outer surfaces of the lower substrate,
   wherein the upper and lower polarizing plates have polarization axes disposed to be perpendicular to each other.

9. The double-sided light emitting device as claimed in claim 8, wherein the lower and upper polarizing plates are polarizing films bonded on the inner surfaces of the lower and upper substrates, respectively.

10. The double-sided light emitting device as claimed in claim 8, wherein the upper polarizing plate is a polarizing film bonded on the inner surface of the upper substrate, and the lower polarizing plate is a polarizing film bonded on the outer surface of the lower substrate.

11. The double-sided light emitting device as claimed in claim 8, wherein the upper polarizing plate is a polarizing film bonded on the outer surface of the upper substrate, and the lower polarizing plate is a polarizing film bonded on the inner surface of the lower substrate.

12. The double-sided light emitting device as claimed in claim 8, wherein the lower and upper polarizing plates are polarizing films bonded on the outer surfaces of the lower and upper substrates, respectively.

13. The double-sided light emitting device as claimed in claim 8, wherein the lower and upper polarizing plate each are a polarizing film having a thickness from about 50 µm to 300 µm.

* * * * *